US006919736B1

(12) United States Patent
Agrawal et al.

(10) Patent No.: US 6,919,736 B1
(45) Date of Patent: Jul. 19, 2005

(54) FIELD PROGRAMMABLE GATE ARRAY HAVING EMBEDDED MEMORY WITH CONFIGURABLE DEPTH AND WIDTH

(75) Inventors: Om P. Agrawal, Los Altos, CA (US); Bradley A. Sharpe-Geisler, San Jose, CA (US); Bai Nguyen, Union City, CA (US); Yu Huang, Cambridge, MA (US); Jack Wong, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 90 days.

(21) Appl. No.: 10/620,286

(22) Filed: Jul. 14, 2003

Related U.S. Application Data

(63) Continuation-in-part of application No. 10/406,050, filed on Apr. 2, 2003, and a continuation-in-part of application No. 10/194,771, filed on Jul. 12, 2002.

(51) Int. Cl.[7] .............................................. H03K 19/177
(52) U.S. Cl. ........................................... 326/41; 326/38
(58) Field of Search ..................................... 326/38–41

(56) References Cited

U.S. PATENT DOCUMENTS

| | | | | |
|---|---|---|---|---|
| 5,933,023 A | * | 8/1999 | Young ........................... | 326/40 |
| 6,211,695 B1 | * | 4/2001 | Agrawal et al. ............... | 326/40 |
| 6,242,946 B1 | * | 6/2001 | Veenstra ........................ | 326/41 |
| 6,774,672 B1 | * | 8/2004 | Lien et al. ..................... | 326/47 |
| 6,800,884 B1 | * | 10/2004 | Feng et al. .................. | 257/209 |

* cited by examiner

*Primary Examiner*—Don Le

(57) ABSTRACT

A field programmable gate array (FPGA) has plural columns of run-time memory provided in each of one or more partitions. Each column of run-time memory has a plurality of configurable memory blocks (CMB's). Each CMB is programmably configurable at least into a shallow-and-widest mode where data words have a maximum bit width and into a deep-and-narrowest mode where data words have a minimum bit width. Each CMB spans plural interconnect buses and the bits of its widest data words are distributed among the spanned interconnect buses. When a deep-and-narrow mode is invoked, CMB's of alternate columns operate in complementary fashion so that bits of narrowed words from one CMB move through a first subset of the interconnect buses while bits of narrowed words from a second CMB, in an alternate column, move through a second subset of the interconnect buses, where the second subset is mutually exclusive of the first subset of the interconnect buses. On the other hand, when the shallow-and-widest mode is invoked, the bits of the wide words of CMB's in alternate columns shared interconnect buses on an overlapping basis. In one embodiment, the shared interconnect buses are tri-statable. Programmable joiners are provided for joining or disjoining the tri-statable interconnect buses of adjacent partitions.

13 Claims, 12 Drawing Sheets

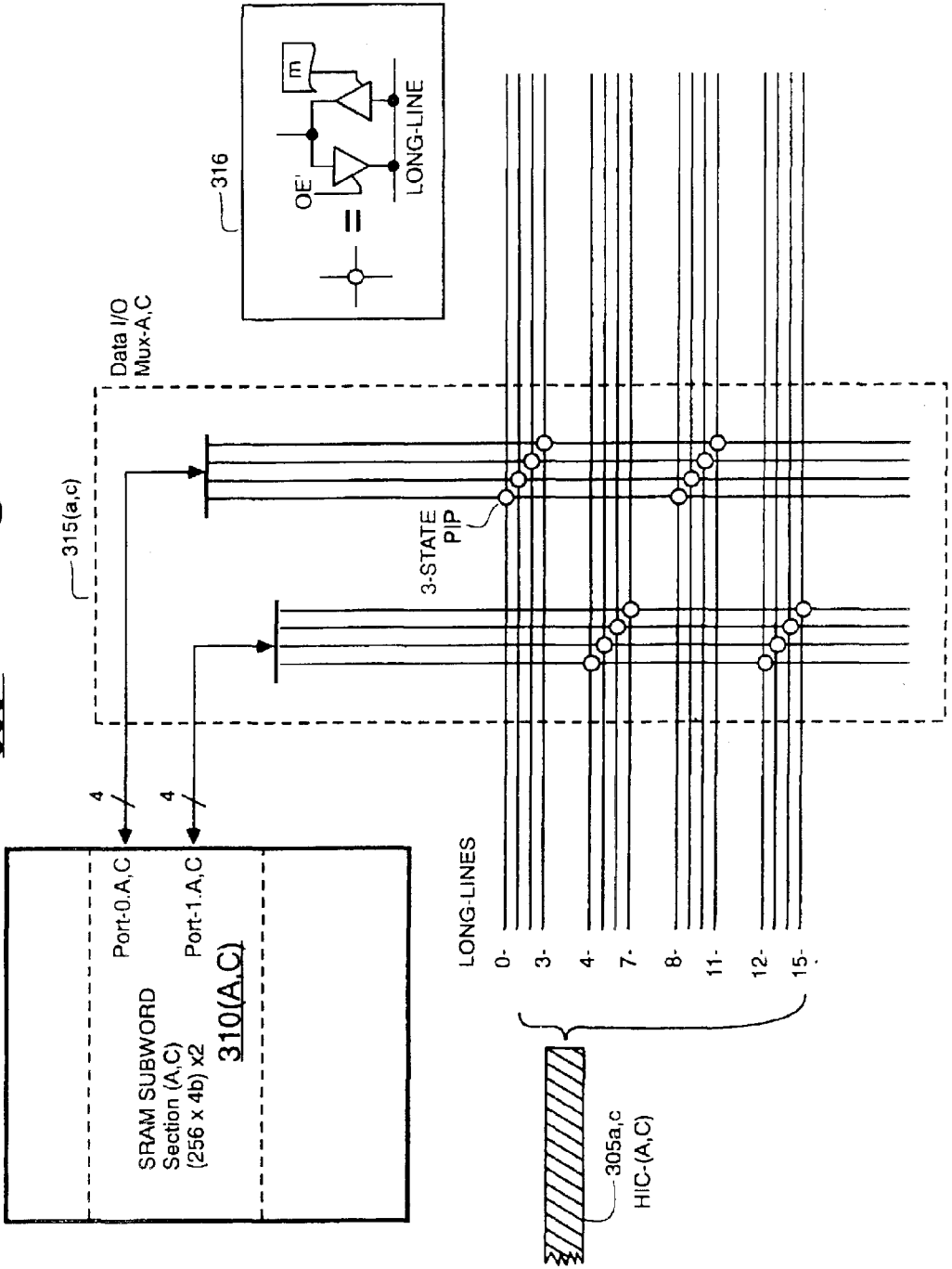

400"

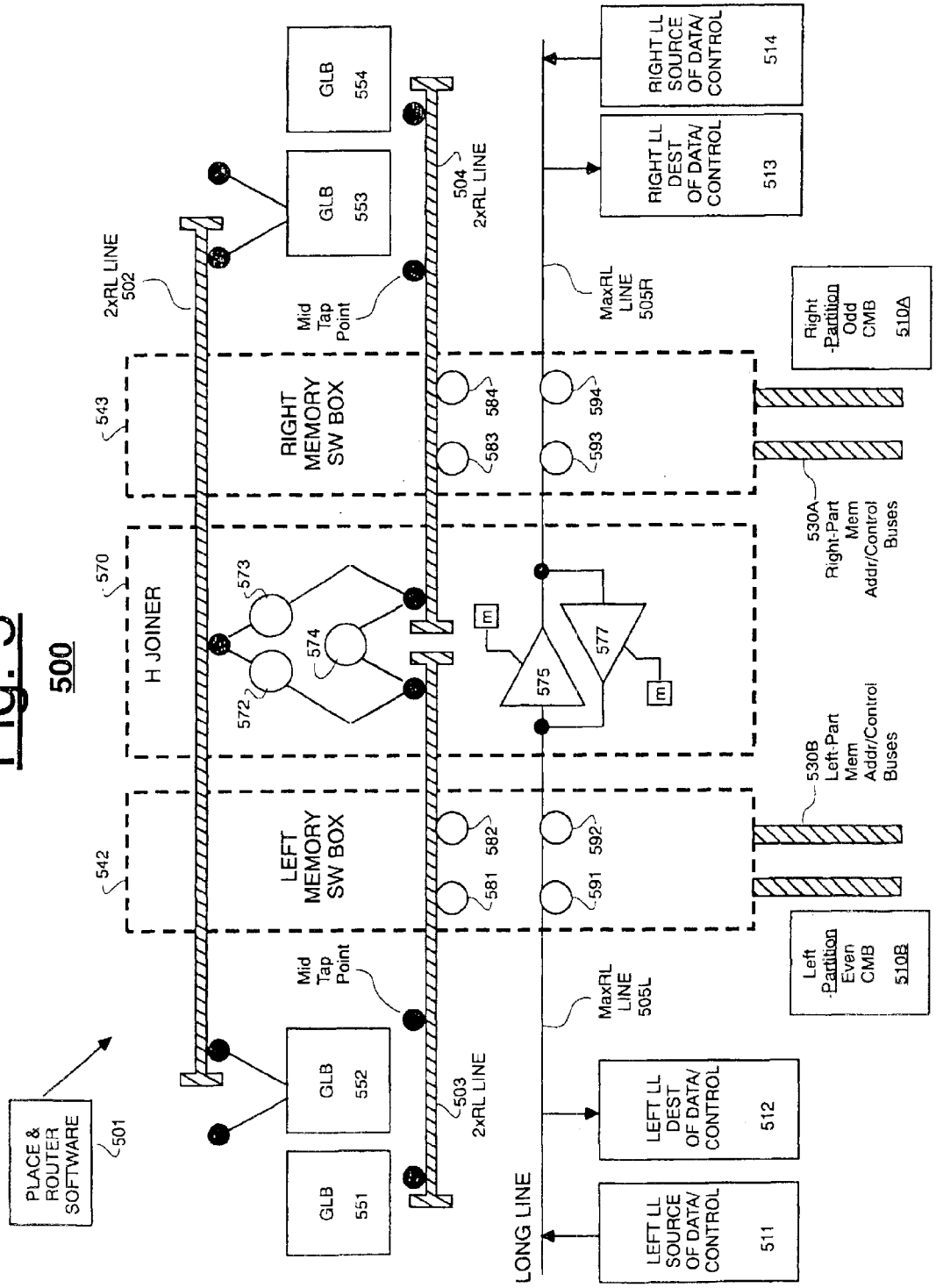

FIELD PROGRAMMABLE GATE ARRAY HAVING EMBEDDED MEMORY WITH CONFIGURABLE DEPTH AND WIDTH

RELATED APPLICATION DATA

This application is a continuation-in-part (CIP) of U.S. application Ser. No. 10/406,050 filed Apr. 2, 2003 by Om P. Agrawal et al. where the latter is a continuation-in-part (CIP) of U.S. application Ser. No. 10/194,771 filed Jul. 12, 2002 by Om P. Agrawal et al. and this application incorporates by reference the disclosure of each of said parent applications.

CROSS REFERENCE TO CO-OWNED U.S. APPLICATIONS

The following copending U.S. patent applications are owned by the owner of the present application, and their disclosures are incorporated herein by reference:

(A) Ser. No. 10/406,050 filed Apr. 2, 2003 by Agrawal et al., and originally entitled, "Hierarchical General Interconnect Architecture for High Density FPGA'S", which application is also a CIP of below-cited U.S. appllcatlon Ser. No. 10/194,771; and (B) Ser. No. 10/406,050 filed Jul. 12, 2002 by Om P. Agrawal et al.

CROSS REFERENCE TO U.S. PATENTS

The disclosures of the following U.S. patents are incorporated herein by reference:

(A) U.S. Pat. No. 6,211,695 B1, issued Apr. 3, 2001 to Agrawal et al. and entitled "FPGA Integrated Circuit Having Embedded SRAM Memory Blocks with Registered Address and Data Input Sections"; and (B) U.S. Pat. No. 6,127,843, issued Oct. 3, 2000 to Agrawal et al. and entitled "Dual Port SRAM Memory for Run Time Use in FPGA Integrated Circuits".

TECHNICAL FIELD

The present disclosure of invention relates generally to integrated circuits and more specifically to the integration of configurable memory blocks with configurable logic blocks and/or configurable I/O blocks in Programmable Logic Devices (PLD's), and even more specifically in a subclass of PLD's known as Field Programmable Gate Arrays (FPGA's).

BACKGROUND

Field-Programmable Logic Devices (FPLD's) have continuously evolved to better serve the unique needs of different end-users. One evolutionary branch of FPLD's has grown along a paradigm known as Field Programmable Gate Arrays or FPGA's. Early examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device may be characterized as an integrated circuit that has four major features (1)–(4) as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT. Other terms used by other vendors for their logic blocks include VGB's (Variable Grain Blocks), GLB's (Granulatable Logic Blocks) and PFU's (Programmable Function Units).

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

(5) In addition to the abovementioned, four basic components, it is sometimes desirable to include on-chip reprogrammable memory that is embedded between CLB's and available for run-time use by the CLB's and/or other resources of the FPGA for temporarily holding storage data. This embedded run-time memory is to be distinguished from the configuration memory because the latter configuration memory is generally not reprogrammed while the FPGA device is operating in a run-time mode. The embedded run-time memory may be used in speed-critical paths of the implemented design to implement, for example, FIFO or LIFO elements that buffer data words on a first-in/first-out or last-in/first-out basis. Read/write speed and appropriate interconnecting of such on-chip embedded memory to other resources of the FPGA can limit the ability of a given FPGA architecture to implement certain speed-critical designs.

Integration of embedded run-time memory with the other resources of an FPGA may present a number of problems. One problem is how to provide relatively large amounts of storage capacity with minimal consumption of circuit space that could be otherwise used for providing the other kinds of resources of the FPGA (e.g., logic blocks, IOB's, interconnect). Another problem is how to provide flexibility so that the embedded run-time memory can alternatively function as shallow-and-wide memory or deep-and-narrow memory depending on need. Another problem is how to provide efficient matching of memory data-width and memory address width with data-processing widths of adjacent logic blocks and/or IOB's. Solutions are provided herein.

INTRODUCTORY SUMMARY

Structures and methods may be provided in accordance with the present disclosure of invention for solving the above-described problem of integrating embedded memory with other resources of an FPGA.

More specifically, in accordance with one set of aspects of the present disclosure, structures techniques are provided for allowing one or more of the following:

1) Elective use of a shallow-and-wide memory mode or a deep-and-narrow memory mode;

2) Complementary coverage of data I/O interconnect channels by complementary ones of configurable memory blocks that are in respective, deep-and-narrow memory modes;

3) Programmable stitching together of memory partitions which could otherwise operate independently with respect to memory data I/O signals and/or memory address/control signals; and 4) Providing a hardware block that blocks place-and-route software from completely disjoining general interconnect routes between adjacent memory partitions.

Other aspects of the disclosure will become apparent from the below detailed description.

BRIEF DESCRIPTION OF THE DRAWINGS

The below detailed description section makes reference to the accompanying drawings, in which:

FIG. 3C shows a data I/O multiplexer which can be used for the 4-bit wide subwords of the configurable memory blocks of FIGS. 3A and 3B;

FIG. 5 is a block diagram showing how a Horizontal Joiner may be structured to cooperate with general interconnect and longlines of one embodiment.

DETAILED DESCRIPTION

Figure 1:
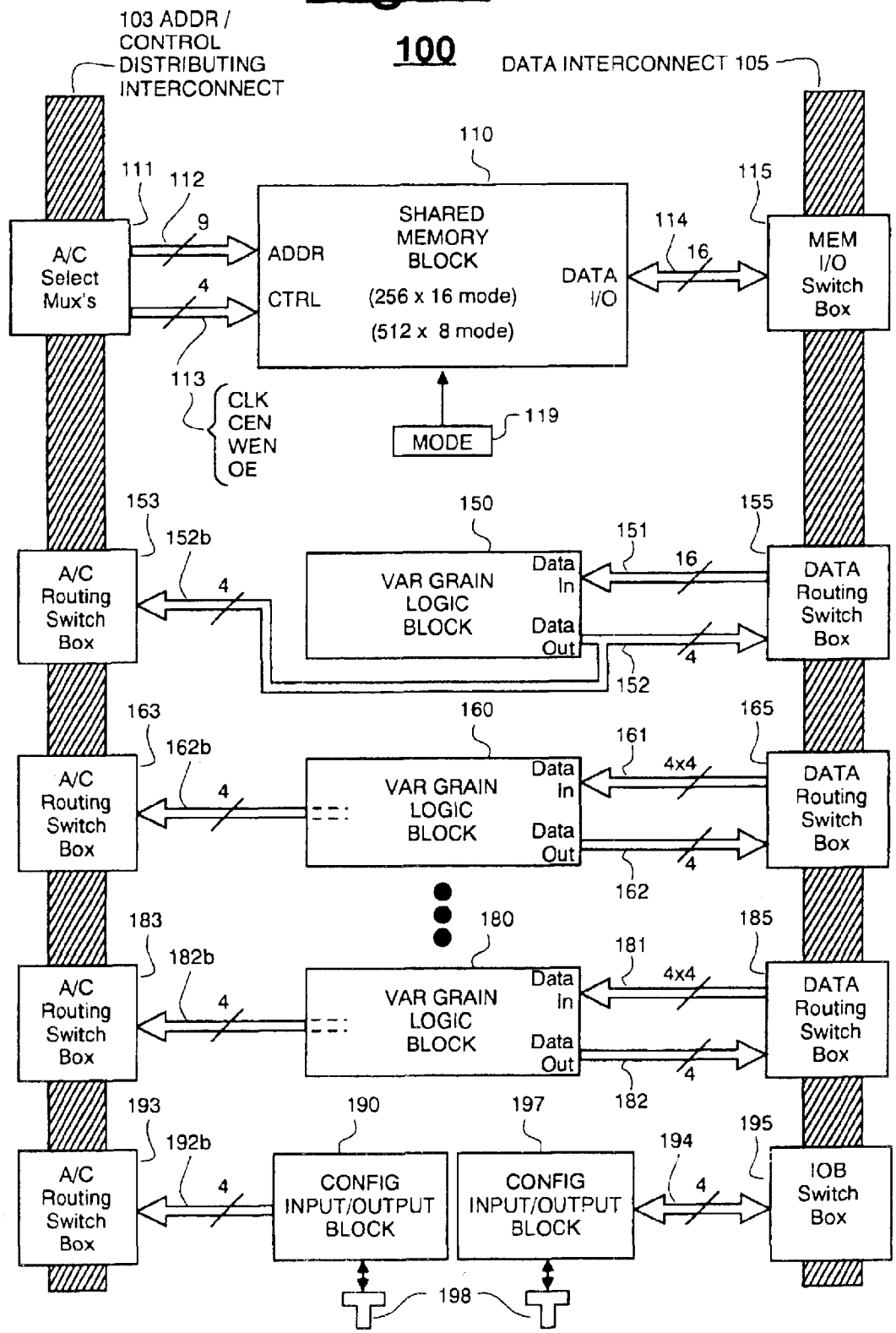
FIG. 1 is a block diagram for illustrating data width concepts involved in use of shared memory blocks.

FIG. 1 schematically introduces an FPGA 100 whose circuitry includes a run-time-wise utilized, memory block 110 which is integrated with a plurality of configurable logic blocks such as those shown at 150, 160, . . . , 180 and/or with one or more input/output blocks, i.e., IOB's 190, 197.

It may be seen from the broad overview of FIG. 1, that address and control signals (ADDR 112, CTRL 113) are to enter the shared memory block 110 via a first set of interconnect resources 103 while corresponding data signals are to move between the shared memory block 110 and other FPGA parts via a second set of interconnect resources 105. Interconnect resources 103 are also referred to herein as address and control distribution interconnect 103 or A/C interconnect 103. Interconnect resources 105 are also referred to herein as data distribution interconnect 105 or more simply D interconnect 105.

During FPGA run-time, the shared memory block 110 is to be used for dynamically storing and recalling addressed data. The stored and/or recalled data may be generated by, and/or used by, the logic blocks and/or IOB's. More specifically, a first subset of the logic blocks and/or IOB's may be used to supply run-time address and control signals (A/C 112, 113) to the memory block 110. The supplied A/C signals may define what location(s) within the shared memory block 110 are to be addressed, and they may further determine whether a given memory access operation is to be a data read (R) or a data write (W) operation and/or when the operation will take place. In the illustrated embodiment, a memory control bus 113 carries four control signals into the memory block, namely, CLK (clock), CEN (clock enable), WEN (write enable) and OE (output enable—where the latter can enable tri-state output drivers, not yet shown, of memory data bus 114). The illustrated memory address bus 112 carries nine address signals. The 9 ADDR signals enable unique referencing of up to 512 memory locations within the memory block. Other numbers of control and address signals are of course possible.

The ADDR bus 112 and CTRL bus 113 may receive their respective address and control signals from the adjacent, A/C distribution interconnect channel 103. Channel 103 may be used to distribute common address and/or control signals to a plurality of memory blocks (not all shown) like block 110. A set of address/control selecting multiplexers 111 (A/C Mux's) may be used by block 110 for selectively acquiring desired ones of address and control signals from the adjacent interconnect channel 103. Others of the memory blocks (not shown) may select their respective A/C signals from corresponding A/C Mux's (not shown) like 111. Many different kinds of designs are possible for the address/control distributing channel 103 and A/C Selecting Mux's 111. No, one particular A/C distributing channel design is preferable over others for the present disclosure. A/C routers 153, 163, . . . , 193 represent generic means for selectively injecting address and/or control signals into A/C channel 103 and moving the injected signals along the A/C channel 103.

While address and control signals are being supplied by a first subset of logic blocks/IOB's, a second subset of logic blocks and/or IOB's may be used to supply corresponding WRITE data to, and/or receive corresponding READ data from, the shared memory block 110. The D interconnect channel 105 can serve as a means for carrying the corresponding memory data signals of memory block 110. No, one particular Data distributing channel design is preferable over others for the present disclosure. Box 115 represents in a general way, a programmable routing means by way of which data signals (114) of the memory block 150 can be selectively routed between the memory block and the data distributing interconnect 105. In one embodiment, memory data passes by way of a bidirectional, data I/O bus 114. The data I/O bus 114 of the illustrated example is structured to carry a maximum of sixteen (16) parallel data bits at a time. Other maximum numbers for the parallel data output width of bus 114 are of course possible.

A problem arises if the data word width of memory blocks such as 110 (the number of bits per valid input or output word) is made programmably variable. In the illustrated embodiment 100, a mode fuse 119 is provided (for all memory blocks or for each of specific subsets of memory blocks) and it is made programmable prior to FPGA runtime so that users can elect to put the shared memory block 110 (and optionally others driven by fuse 119) into one of a plurality of configuration modes including: (a) a shallow-and-wide first mode (e.g., 256 words by 16 bits per word mode) and (b) a deep-and-narrow second mode (e.g., 512 words by 8 bits per word mode). The address-space versus data-width variability is selected depending on user needs. Some FPGA applications may benefit more from having a deeper address space while others may instead benefit more from having a wider word width. Fuse 119 gives users the choice. Although the illustrated embodiment provides just two choices of address-space versus data-width, larger numbers of choices and/or different values within the choices are of course possible. For example, there could also have been a 1024×4 mode. This option would disadvantageously entail using more configuration memory bits for defining fuse 119 and it would add to the internal complexity of memory block 110.

Because the width of the memory data words can change substantially (by a multiplying factor of $2^n$), this depending on the settings of the mode fuse 119, a substantial number of the data I/O lines in bus 114 may become unusable if a narrow mode is selected. This is particularly true if the narrowest data-width mode is selected (e.g., the 1024×4 bits mode, if that had been an available choice, in which case only 4 of the 16 parallel lines on bus 114 would be usable and the remaining 12 lines would be unusable). The fact that some lines on bus 114 may go unused is not of itself a big problem. However, the lines of data I/O bus 114 do not exist as isolated islands. Bus 114 weaves into other FPGA resources, and those weave into further resources. There is a rippling effect. If the resources of a bus such as 114 are not uniformly available to the rest of the FPGA, then congestion or other problems may arise for the place-and-route software.

More specifically, in the illustrated embodiment 100, the routing uniformity problem may arise at the data-routing switchbox 115 which selectively routes data bits between bus 114 and further lines of the data interconnect channel 105. This data-routing switchbox 115 has connections for each of possibly-unusable lines of bus 114 and it has further connections for each of the further lines of D channel 105. Those further lines of D channel 105 operatively couple to yet further data-routing switchboxes such as the ones shown at 155 and 195, where the latter switchboxes are provided for selectively routing data bits to, or from, respective logic blocks (e.g., 150) and/or I/O blocks (e.g., 197). If certain D-channel connections of switchbox 115 become unusable due to the MODE 119 setting, the unusability can ripple along D-channel 105 to create unusability problems elsewhere. Unusability does not mean that there may be no way of getting desired signals from one point to another. Instead it may mean that certain paths for quickly carrying corresponding memory data between resources may be cut off if those resources lie adjacent to interconnect channel 105.

The latter shortcoming creates a problem for place-and-route software. It is a job of the place-and-route software is to find a workable placement and routing solution for fully implementing a supplied design goal by using the configurable resources of the FPGA. This job can be made easier if there are more rather than less interconnect resources available within the FPGA for carrying certain kinds of signals, including memory data signals, from one location to another. However, if the setting of fuse 119 causes certain interconnect lines within D channel 105 to become unusable for the purpose of quickly carrying memory data between memory block 110 and other FPGA resources, then the job of the place-and-route software can become more difficult or even impossible to complete.

Looking at the problem with more particularity, there can be certain place-and-route operations in which it becomes desirable to "relatively-relocate" some already-solved parts of the place-and-route problem/solution so as to make room for still not-annealed parts of the problem. In other words, it may be desirable to have pre-solved configurations which can be easily moved by the place-and-route software vertically and/or horizontally among the respective rows and columns of the FPGA array so as to make more room for other, not-yet-resolved parts of the FPGA implementation. However, if some interconnect rows or columns are unusable for the purpose of quickly carrying memory data directly from a memory block (e.g., 110) to a relatively relocated destination (e.g., IOB 197), that usage limitation (which limitation can develop when memory block 110 is in the deep/narrow configuration mode) will work to disadvantageously reduce the flexibility afforded to the place-and-route software. That in turn will impede the place-and-route software from easily producing a final logic placement and routing solution.

Referring still to the details of FIG. 1, there are further issues that plague the integration of memory blocks with logic blocks and I/O blocks. Aside from providing relative-relocatability, it is desirable from an efficiency standpoint to have a fairly close match between the bit-widths of the data processed by the logic blocks and the bit-widths of the control and address words handled by the memory block. It is desirable to have predictable delay between the sources of the A/C signals and destination buses 112, 113 so that timing critical memory accesses can occur within prespecified timing windows. It is further desirable from an efficiency standpoint to have a fairly dose match between the bit-widths of the data processed by the logic blocks and the bit-widths of the data words (114) passing through the memory block 110.

The configurable logic blocks of FIG. 1 are called GLB's (variably-Granulatable Logic Blocks). The above-cited U.S. application Ser. No. 10/194,771 provides a more detailed description of such GLB structures. Many of those details are not important here. It is sufficient to view the GLB's (150, 160, . . . 180) as being each organized to receive approximately 16 bits of input data (e.g., on bus 151), to process the received 16 bits of input data (or a subset thereof), and to output a corresponding 4 bits or less of output data (e.g., on bus 152). The 16 bits of GLB input data can be viewed as four (4) sets of 4 bits each—in otherwords a 4×4 organization. There are four lookup tables (LUTs, not shown) inside of each GLB. Each such LUT receives four input term bits and produces a programmably defined result bit. The 4×4 input aspects of the GLB inputs is schematically indicated in FIG. 1 for the 16-bit wide buses 161 and 181 of respective GLB's 160 and 180. The four LUT's inside each GLB may be programmably folded together to function as two 5-input LUT's or one 6-input LUT. Because of its programmable configurability, a given GLB (150–180) may be configured to respond to sixteen (16) input data bits or a fewer number of input data bits. The 16 input term bits may come from an embedded memory block such as 110 and/or from elsewhere. If a memory block such as 110 is in a narrow-data mode (with word width of less than 16), its I/O switchbox (e.g., 115) will not be able to couple a full 16 bits of parallel data through bus 114, through switchbox 115 and along D-channel 105 for coupling into the 16-bit wide input ports (e.g., 151–181) of one or more GLB's. This can become a problem.

The data-width problem between configurable memory (110) and other FPGA resources is not limited to 16-bit-wide input term data going into an individual GLB (e.g., into 150 via path 151). It can happen when groups of GLB's and/or IOB's are ganged together for data I/O operations. For example, although the 4-LUTs (not shown) in each GLB produce just 4 bits of result data (generally speaking, and on output buses 152, 162, . . . , 182), the place-and-route software may elect to gang four such GLB's together for feeding 16 bits of parallel WRITE data into embedded memory blocks such as 110. However, if those memory blocks (e.g., 110) are in their deep/narrow modes (e.g., 512×8), then part (e.g., 182) of the ganged-together output data bits produced by the ganged-together GLB's and/or IOB's may be blocked from being quickly stored into the embedded memory (110). Such reduction of storage bandwidth can be a problem.

FIG. 1 indicates that up to 4 bits of memory I/O data may come from, or be routed to, configurable IOB's such as 110 block 197. The IOB data may be used for respective input or output via chip-external pins. The pins are denoted as 198 in FIG. 1. If memory block 110 is in its deep/narrow mode (e.g., 512×8), then some IOB-conveyed data signals (194) may be blocked from quickly moving into or out of that embedded memory block 110. This limitation on bandwidth can be a problem.

Figure 2A:
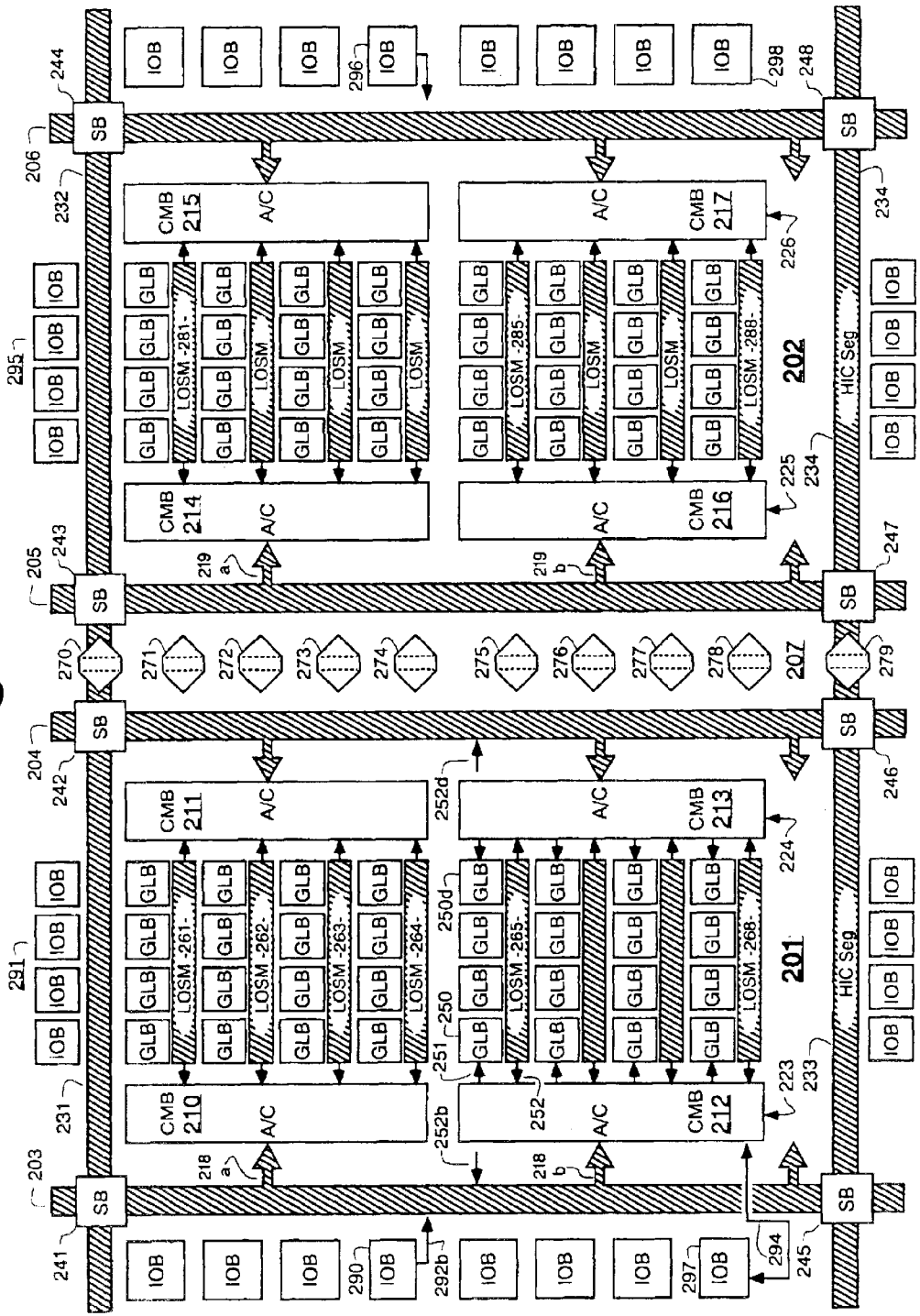
FIG. 2A is a block diagram of a programmably partitionable FPGA in accordance with the disclosure.

Referring now to FIG. 2A, it is to be understood that FIG. 1 was merely a one-dimensional schematic representation of possible couplings between a single memory block 110 and respective GLB's 150–180 and/or IOB's 190–197. However, in a practical FPGA, signal flow often has multidimensional aspects and involves plural memory blocks communicating with a multi-dimensional matrix of logic blocks, I/O blocks and interconnect channels. FIG. 2A therefore shows a two-dimensional schematic view of an FPGA device 200 that is structured in accordance with the disclosure. Eight (8) configurable memory blocks (CMB's) are respectively shown at positions 210–217. The CMB's 210–217 can be used as independent individual units. Alternatively or additionally, CMB's of a given vertical column can be controlled with common address/control (A/C) signals (e.g., sent through ports 218a and 218b). Alternatively or additionally, CMB's of respective odd and even columns (e.g., 223, 224) may be operated as complementary sets when the CMB's are placed in a deep-and-narrow memory mode. More specifically, configurable memory blocks 210–211 may define a first complementary pair of blocks that can cooperate with one another to provide continuous interconnect coverage when in deep-and-narrow memory mode, as shall be detailed below. Further such complementary sets may be defined by respective CMB pairs: 212–213, 214–215, and 216–217. This form of complementing is not limited to CMB's within a given partition (e.g., 201 versus 202). If a partitions horizontal-joining mode is activated, then CMB's 210 and 215 may be operated as a complementary pair. Alternatively, CMB's 211 and 214 may define a complementary pair as shall become apparent from the below details.

Each CMB (Configurable Memory Block) is situated in one of two vertical columns of a respective partition. Thus CMB's 210 and 212 are situated in a Left vertical column (or odd numbered column which is denoted here as 223) of a first partition 201, while CMB's 211 and 213 are situated in a Right vertical column (or even numbered column 224) of the first partition 201. Similarly, CMB's 214 and 216 are disposed in a Left vertical column (225) of a second partition 202, while CMB's 215 and 217 are located in a Right vertical column (226) of the second partition 202. There can be a larger number of partitions and/or a larger number of configurable memory blocks (CMB's) per partition and/or a larger number of CMB columns within each partition. FIG. 2A is merely an introductory example.

The Left and Right vertical CMB columns of each partition in FIG. 2A are serviced by respective address and control distributing channels. Left CMB column 223 is serviced by A/C distributing channel 203. Right CMB column 224 is serviced by A/C distributing channel 204. Similarly, the second Left CMB column 225 is serviced by A/C distributing channel 205 and the second Right CMB column 226 is serviced by A/C distributing channel 206.

Interposed between the first and second partitions 201–202 there is a set 207 of programmable, horizontal joining units 270–279 (H-joiners. Each H-joiner is bracketed by Left and Right memory-servicing switchboxes. To avoid illustrative clutter, FIG. 2A only shows SB's 242 and 243 bracketing H-joiner 270 (top) and switchboxes 246–247 bracketing H-joiner 279 (bottom). Further such pairs of Left and Right memory-servicing switch-boxes are understood to bracket each of respective H-joiners 271–278.

In a first programmably-established mode, each of the horizontal joining units 270–279 may be configured to keep the first and second partitions (210, 202) at least partially disconnected from one another (e.g., so that so-called, horizontal longlines of one partition do not directly drive horizontal longlines of the adjacent partition—the longlines are not yet shown). In at least a second programmably-established mode, the H-joiners 270–279 may be configured to operatively join the first and second partitions (210, 202) so that at least some horizontal longlines of one partition (e.g., 201) actively drive onto corresponding horizontal longlines of the other partition (e.g., 202) whatever signals are present on the first set of horizontal longlines (those in partition 201). As will be seen, normally, each longline of a given partition can be driven by a plurality of tri-state buffers within that given partition. Normally, the respective output enable (OE) terminals of each tri-state buffer in the given partition may be activated during appropriate time windows to allow each corresponding tri-state buffer to become master over a longline in that buffer's partition. However, if a given horizontal joining unit (270–279) is placed in a drive-Left mode or a drive-Right mode (see briefly, FIG. 2C) then the correspondingly driven, horizontal longline is precluded, in one embodiment, from having its own tri-state buffers act as masters by driving their signals onto that longline because the given horizontal joining unit (e.g., 270) is instead permanently driving a mirror signal onto the driven longline from a master in a different partition. More on this below.

Each CMB (Configurable Memory Block) of FIG. 2A spans four rows of GLB's (variably Granulatable Logic Blocks) within its respective partition. Four (4) horizontal interconnect channels (HIC's—not all shown) are assigned to each CMB for immediately carrying the Read and Write data of that CMB from/to that Configurable Memory Block. The same four HIC's extend adjacent to a row of GLB's so that Read/Write data can immediately move between the GLB's (logic blocks) and/or IOB's (Input/Output blocks) of that row and the associated CMB (memory block).

Each horizontal interconnect channel is divisible into a plurality of channel segments. Channel segment 231 forms a left part of the Horizontal Interconnect Channel (HIC) shown at the top of FIG. 2A while channel segment 232 forms another part of the same HIC. H-joiner 270 is interposed between the segments for programmably splitting or joining certain components (e.g., longlines) of segments 231 and 232.

The HIC (231–232) which is illustrated at the top of FIG. 2A turns out to not be one of the HIC's that immediately carries the data of CMB's 210 or CMB 214. Instead such a HIC (not shown, but nonetheless implied) extends across the horizontal area occupied by the symbols for LOSM-261 and LOSM-281. That implied HIC is programmably bisectable by H-joiner 271. To further avoid illustrative clutter, the associated HIC's of H-joiners 272–278 are also not explicitly shown in FIG. 2A. At the bottom of FIG. 2A, yet another exemplary HIC is shown to have first and second segments 233–234 with H-joiner 279 interposed between them. The latter H-joiner is also shown interposed between memory switchboxes 246–247.

In the neighborhood of the lower-left CMB (configurable memory block) 212 a number of aspects are detailed. Arrowed line 251 represents the ability of CMB 212 to transfer its Read data immediately to GLB 250 by way of a longline (not shown) which is situated in the HIC segment (also not shown) of LOSM structure 265. Arrowed line 252 represents the ability of CMB 212 to receive its Write data immediately from GLB 250 by way of LOSM structure 265 and further by way of a longline (not shown) that is situated in the associated HIC of LOSM-265.

In one embodiment, the LOSM-265 structure is a fully-populated output switch matrix (OSM) that services a horizontally extending group of four (4) successive GLB's (e.g., logic blocks 250 through 250*d*). The fully-populated crossbar nature of LOSM-265 allows any GLB in the 250–250*d* horizontal group to selectively output a respective GLB result signal to any longline (not shown) in the associated HIC segment (not shown—see instead segment 231 or 233) of that LOSM-265.

In one embodiment, the longlines of the LOSM-265 HIC segment (see instead segment 231) are structured so that Read and Write data transfer may also occur in similar ways between the complementary, right CMB 213 of that partition (201) and the GLB's of group 250–250*d*. The Left CMB 212 may serve as a run-time data source which supplies input data (READ data) to its associated GLB's (e.g., 250–250*d*) for processing in those GLB's during run time. The Right CMB 212 may serve as a run-time data sink which collects and stores (as WRITE data) the processed result signals of the GLB's sandwiched between configurable memory blocks (CMB's) 212 and 213. Alternatively, either one of CMB's 212 and 213 may function as both the data source and data sink for signals processed by the sandwiched GLB's (e.g., 250–250*d*).

Alternatively or additionally, CMB 212 may immediately receive WRITE data from IOB 297 and CMB 213 may immediately output Read data to another IOB (e.g., 298). As a consequence, a FIFO interface (first-in, first-out) may be defined between the GLB input data and the GLB output data and nodes outside of the illustrated FPGA 200. In one embodiment, each of CMB's 210–217 is independently dual ported, meaning that an IOB can be transferring data into/out-of a first port under control of a corresponding first clock while a GLB is simultaneously transferring data out-of/into a second port of the same CMB (210–217) under control of a corresponding second clock. Double-arrowed line 294 represents the ability to transfer Read and Write data between IOB 297 and either or both of CMB's 212 and 213 by way of longlines (not shown) in the HIC segment (not shown) associated with the LOSM-268 structure.

IOB's may also be used for supplying address/control (A/C) signals to the CMB's. Single-arrowed line 292*b* represents the ability to transfer address/control (A/C) data from IOB 290 into A/C distributing channel 203 for possible distribution through ports 218*a* and 218*b*. Alternatively or additionally, GLB's may be used for supplying address/control (A/C) signals to the CMB's. Single-arrowed line 252*b* represents the ability to transfer address/control (A/C) data from GLB's such as 250 into A/C distributing channel 203. The latter coupling of A/C signals may be by way of longlines (not shown) in the HIC of OSM-265 and/or by way of so-called Double-Reach Length lines (2×RL lines—not shown) that are also present in the HIC of OSM-265 but are shorter than the longlines. Single-arrowed line 252*d* represents the ability to transfer address/control data from GLB's such as 250*d* into A/C distributing channel 204. The latter coupling of A/C signals may be by way of the longlines in the HIC of OSM-265 and/or by way of shorter 2×RL general interconnect lines (not shown).

A/C signals (address/control) may also be injected into the respective A/C distributing channels: 203, 204, 205 and 206 by way of respective A/C routing switchboxes such as those shown at 241, 242, 243, 244 and/or those shown at 245–248. The latter A/C signals may be routed into HIC segments such as 231–232, 233–234 from adjacent IOB's such as shown at 291 and 295 (top of FIG. 2A) and/or the latter A/C signals may be routed into the same HIC segments 231–234 from adjacent GLB's. Then appropriate memory-servicing switchboxes, such as 241–248 may be used to inject the horizontally-carried signals into the appropriate A/C distributing channels, 203–206. Desired ones of the injected A/C signals may then be selectively transferred through ports such as 218*a–b* or 219*a–b* into the respective configurable memory blocks (e.g., 210–212 or 214–216).

It is to be understood from FIG. 2A that the transfer of Read/Write data and/or address/control (A/C) data in the right-partition 202 can occur independently of such transfers in the left-partition 201, this being particularly true when H-joiners such as 270–279 are respectively in a partitions decoupling mode. However, sometimes it is desirable to share Read/Write data and/or address/control (A/C) data between two or more partitions (e.g., 210, 202). In such a case, one or more of the H-joiners 270–279 can be programmably configured to stitch together desired parts of the adjacent partitions. For example, H-joiner 270 may be used to distribute common address/control (A/C) signals to A/C channels 203 and 206 (via segments 231–232 and SB's 241, 244) so that their respective columns of CMB's, 223 and 226, may operate in synchronism with one another. Address/control (A/C) signals may be sourced from longlines and/or shorter, general interconnect lines (e.g., 2×RL lines).

Figure 2B:
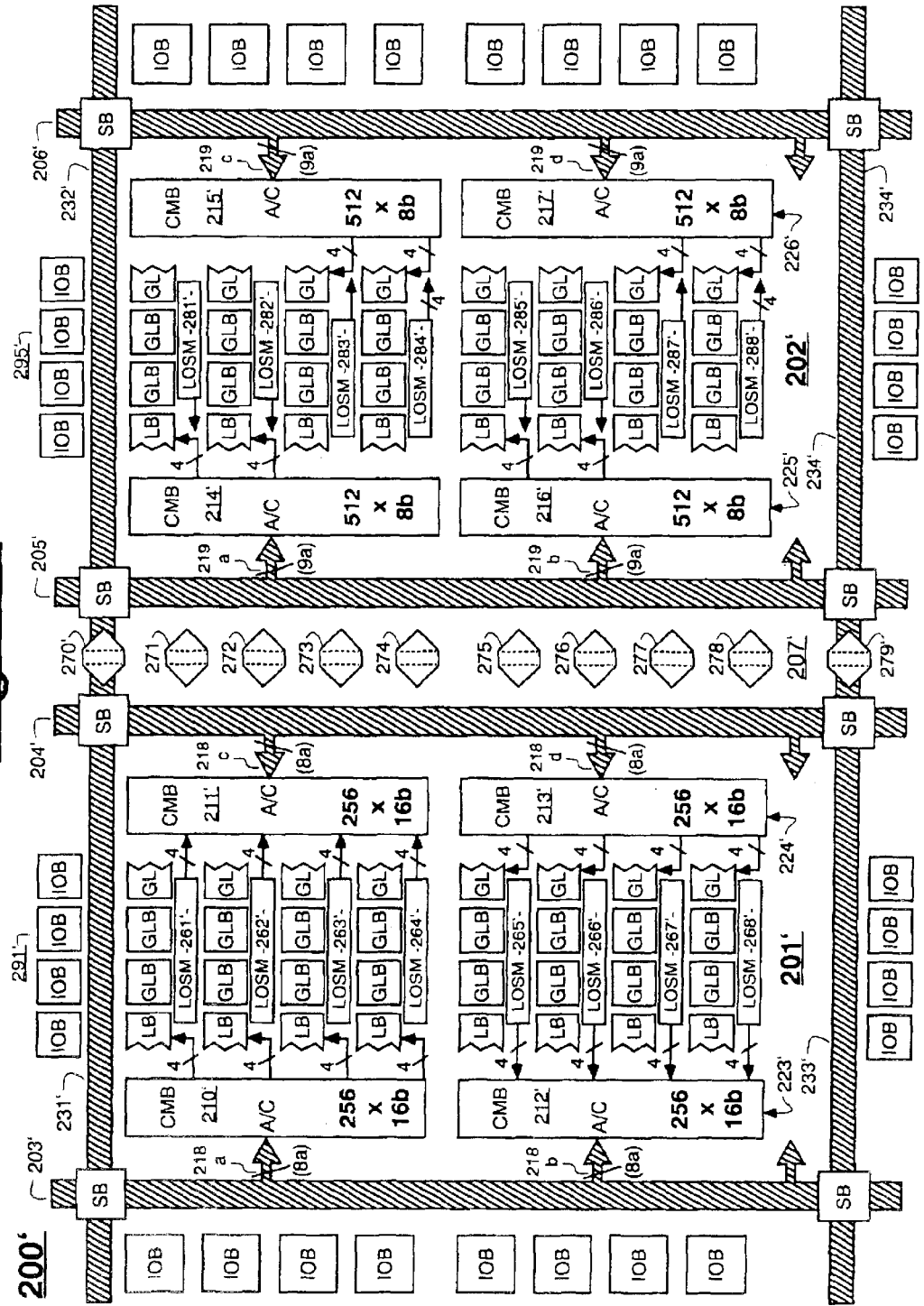
FIG. 2B shows one part of the embodiment of FIG. 2A in a shallow-and-wide mode (e.g., 256×16) while a second part is in a deep-and-narrow mode (e.g., 512×8)

FIG. 2B illustrates a more specific embodiment 200' in which each CMB (configurable memory block) can be programmably placed into at least one of 256×16 b mode (shallow-wide mode) and a 512×8 b mode (deep-narrow mode). For illustration sake, the CMB's of left-partition 201' are shown to be each in the shallow-wide mode (256 addressable words by 16 bits per word) while the CMB's of right-partition 202' are shown to be each in the deep-narrow mode (512 words by 8 bits per word). Other FPGA designs are of course possible wherein the shallow-wide and deep-narrow modes have other parameters. In one further embodiment (not explicitly shown), the shallow-wide mode is 256×18 b for each of two independent ports of a dual ported CMB design and the deep-narrow mode is 512×9 b. The extra one or two bits per word of this further embodiment may be used for parity check or other error correction operations if desired.

To prevent routing congestion in the embodiment of FIG. 2B, the input and output words of each CMB are subdivided into "subwords", for example, groups of 4 bits each and each such group of 4 bits is allocated for routing through a respective data-I/O "sub-bus" to, or from, a different HIC. Thus, in the case where CMB 210' is in the 256×16 bits mode, a first subset of four (4) bits of each of its output words (first subword) is routed to the associated HIC of LOSM-261' via a respective data-I/O sub-bus (not yet shown, see instead sub-bus 314a of FIG. 3A). Similarly, a second 4 bits (second sub-word) of its 16-bit-wide output words are allocated for routing by the associated HIC of LOSM-262'. The third and fourth subsets of 4 bits each are respectively allocated to the HIC's of LOSM's 263' and 264'. In similar vein, the 16-bit input words of CMB 211' are shown to be subdivided into groups of four (4) bits each (four sub-words) so that LOSM-261' and/or its associated HIC can supply a first subset of 4 bits to the corresponding first four (4) input terminals of CMB 211 while LOSM-262' and/or its associated HIC can supply a second set of 4 bits to a corresponding further 4 input terminals of CMB 211'. Similarly, for the third and fourth subsets of nibble-wide inputs entering into CMB 211', these may come from LOSM-263' and LOSM-264' and/or their associated HIC's respectively. (CMB 211' is also structured to output its READ data as respective nibble-wide subsets to the respective HIC's of LOSM's 216'–264' in substantially the same way as is shown for CMB 210'. In one, dual-ported embodiment, the longlines driven by port-1 READ out data of CMB 211' can be different than the longlines driven by port-2 READ out data of CMB 210' so as to avoid collisions between the two configurable memory blocks 210'–211'.) If H-joiners 271–274 are activated to drive longline signals from partition 202' towards partition 201', then the respective four subsets of nibble-wide WRITE data may come into CMB 211' from LOSM's 281'–284' of the right-partition 202' instead of from LOSM's 261'–264' of the left-partition 201'.

CMB's 212' and 213' are drawn in FIG. 2B so as to show that data flow may go in either direction within partition 201. In other words, part or all of the right column 224' of CMB's may function as sources of READ data while pant or all of the left column 223' may function as destinations for storage of WRITE data. Thus, In the illustrated case of CMB's 212' and 213', the right column memory block 213' is outputting READ data while the left column memory block 212' is receiving WRITE data. Each of respective A/C ports 218a–218d is labeled to have an effective width of at least eight address bits (denoted as 8a) for addressing the respective 256 storage words within its respective one of CMB's 210'–213'.

The CMB's of right-partition 202' are shown to be each in the 512 word×8 bit mode (deep-and-narrow mode) in FIG. 2B. Each of A/C ports 219a–219d is accordingly shown to have an effective width of nine address bits (denoted as 9a) for addressing the respective 512 word locations of its respective memory block among CMB's 214'–217'. Only eight of the sixteen DATA I/O terminals of each configurable memory block (among CMB's 214'–217') can transfer storage data (READ or WRITE data) when the corresponding memory block is in it's 512×8 b mode (deep-and-narrow mode). In order to provide full interconnect coverage by embedded memory resources and/or to reduce congestion of embedded memory signals within adjacent interconnect, the present disclosure teaches that when a relatively deep-and-narrow mode is active (e.g., the 512×8 b mode), the CMB's of each odd-numbered column (e.g. column 225') should couple their respective nibbles of READ and/or WRITE data to a first subset of adjacent HIC's (e.g., the upper two HIC's), while the CMB's of each even-numbered column (e.g. column 226') should couple their respective two nibbles of READ and/or WRITE data to a mutually exclusive, second subset of adjacent HIC's (e.g., the lower two HIC's) of the associated groups of four HIC's that pass through or run adjacent to the respective CMB's. Thus FIG. 2B shows the left column CMB, 214' transferring its data bits only by way of the associated HIC's of LOSM-281' and LOSM-282'. By contrast, the complementary CMB 215' in the right column 226' is shown transferring its corresponding 8 bits of READ and/or WRITE data only by way of the respective associated HIC's of LOSM-283' and LOSM-284'. A mandated split use, on a 50%-50% basis is thus forced for the HIC's of LOSM's 281'–284' when CMB's 214' and 215' are in their corresponding, half-wide, deep-and-narrow mode (only 8 out of 16 available Data I/O lines are usable for each CMB and thus each is in a half-wide mode). A similar, 50%-50% interconnect splitting arrangement is shown for CMB's 216'–217' and their associated HIC's of respective LOSM's 285' through 288'. It is within the contemplation of the disclosure that a 25%-25%-25%-25% mutually exclusive split use of the adjacent HIC's would be employed if each CMB had a quarter-wide, deep-and-narrow mode. And of course, proportional other split uses of the adjacent HIC's would be employed if each CMB had other deep-and-narrow modes. On the other hand, when the opposed CMB's of a given partition are in their shallow-and-widest mode (e.g., 256×16 b) the opposed CMB's are allowed to make overlapping use of the adjacent HIC's for transferring their respective data bits.

There are a n umber of advantages to such a full-coverage, mutually exclusive split-use arrangement (e.g., the 50%-50% interconnect split) when the CMB's of a given partition are in a relatively deep-and-narrow mode as opposed to being in their shallow-and-widest mode. First, the possibility of routing congestion is minimized because each HIC is being asked to route the respective subword (e.g., 4 bits) of a fewer number of CMB's when the deep-and-narrow mode is active for those CMB's. Second, if relative relocation is carried out during the placement phase of place-and-route, and the deep-and-narrow mode is active, each relocated design section will still have access to the subword (e.g., 4 bits) of an associated CMB by way of the HIC (e.g. 281'–284') adjacent to which it is relocated because there are active subword lines for each HIC on at least one CMB in the FPGA. Finally, if the shallow-and-widest mode is instead active, the full Data I/O bandwidth capabilities of each CMB (which is in such shallow-and-widest mode) is made available to other FPGA resources.

Figure 2C:
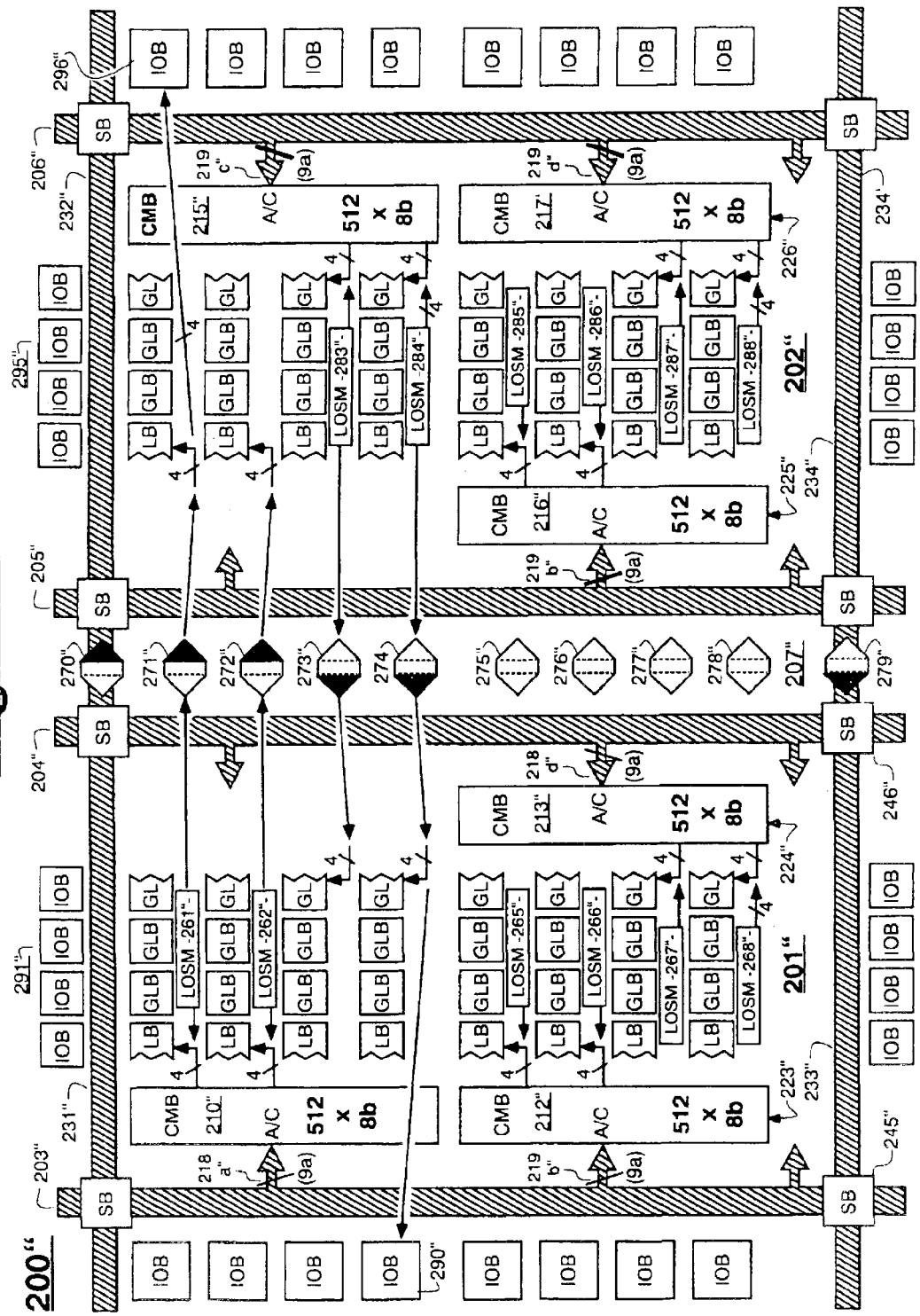
FIG. 2C shows two partitions joined together by horizontal joining units.

Referring to FIG. 2C, there are times when it is desirable to transmit one or both of address/control signals and memory storage data from one partition to the next. FIG. 2C shows an embodiment 200" in which H-joiner 270" has been programmably activated to transmit address and/or control signals from horizontal segment 231" to horizontal interconnect segment 232" so that the latter segment 232" may then route the cross-partition control signals down either one or both of A/C distribution channels 205" and 206". H-joiner 279" is shown to have been activated in the other direction for copying longline signals from segment 234" onto the longlines of segment 233". Thus if horizontal segment 234" is carrying address and/or control signals which are to be shared into the left-partition 201", these may be transmitted through H-joiner 279", through horizontal segment 233" and then through the respective Switch Boxes (SB) 246", 245" for broadcast along their respective A/C distributing channels, 204" and 203".

H-joiners 271" and 272" are shown to have been programmably configured to couple longline signals from LOSM's 261"–262" in the left-partition 201" to corresponding longlines in the right-partition 202". This allows output signals from LOSM's 261" and 262" to be immediately coupled by longlines to associated GLB's in the right-partition 202" as well as to corresponding GLB's in the left-partition 201". It also allows the output signals of LOSM's 261"–262" to be immediately coupled by those horizontal longlines to corresponding IOB's adjacent to the right-partition, say IOB 296" for example. At the same time, the output signals of LOSM's 261"–262" can be immediately coupled by those horizontal longlines to corresponding and usable Data I/O terminals of CMB 210" (e.g., to the upper two nibbles when 512×8 b mode is active). Since the READ data of CMB 210" in the left-partition can be output across partitions to the GLB's of the right-partition 202" when the CMB's are in 512×8 b mode, the place-and-route software is able to programmably relocate partitioned design sections to either partition as well as up and down in each partition during place and route while still preserving the ability to quickly access stored data in the CMB's via use of longlines.

H-joiners 273" and 274" are shown to have been programmably configured to drive signals from the longlines of right-partition 202" to the corresponding longlines of left-partition 201". This configuration allows CMB's 210" and 215" to function as complimentary memory blocks for the 512×8 b mode. CMB 210" provides data coverage for the upper associated HIC's of LOSM 261" and 262" while CMB 215" provides data coverage for the associated HIC's of LOSM 283" and 284". As can be seen, the drive-left mode of H-joiner 274" allows the output signals of LOSM 284" to be immediately coupled by associated horizontal longlines to corresponding IOB 290" In the right-partition.

Not all of the H-joiners have to be activated at the same time. Thus H-joiners 275" through 278" are shown to have been programmably left in the default deactivated state so as to provide separation between the left and right HIC segments associated with respective LOSM's 265'–268" and 285"–288". This allows for independent bus mastery over the longlines of the respective HIC segments associated with LOSM 265"–268" and those associated with LOSM 285"–288".

Figure 3A:
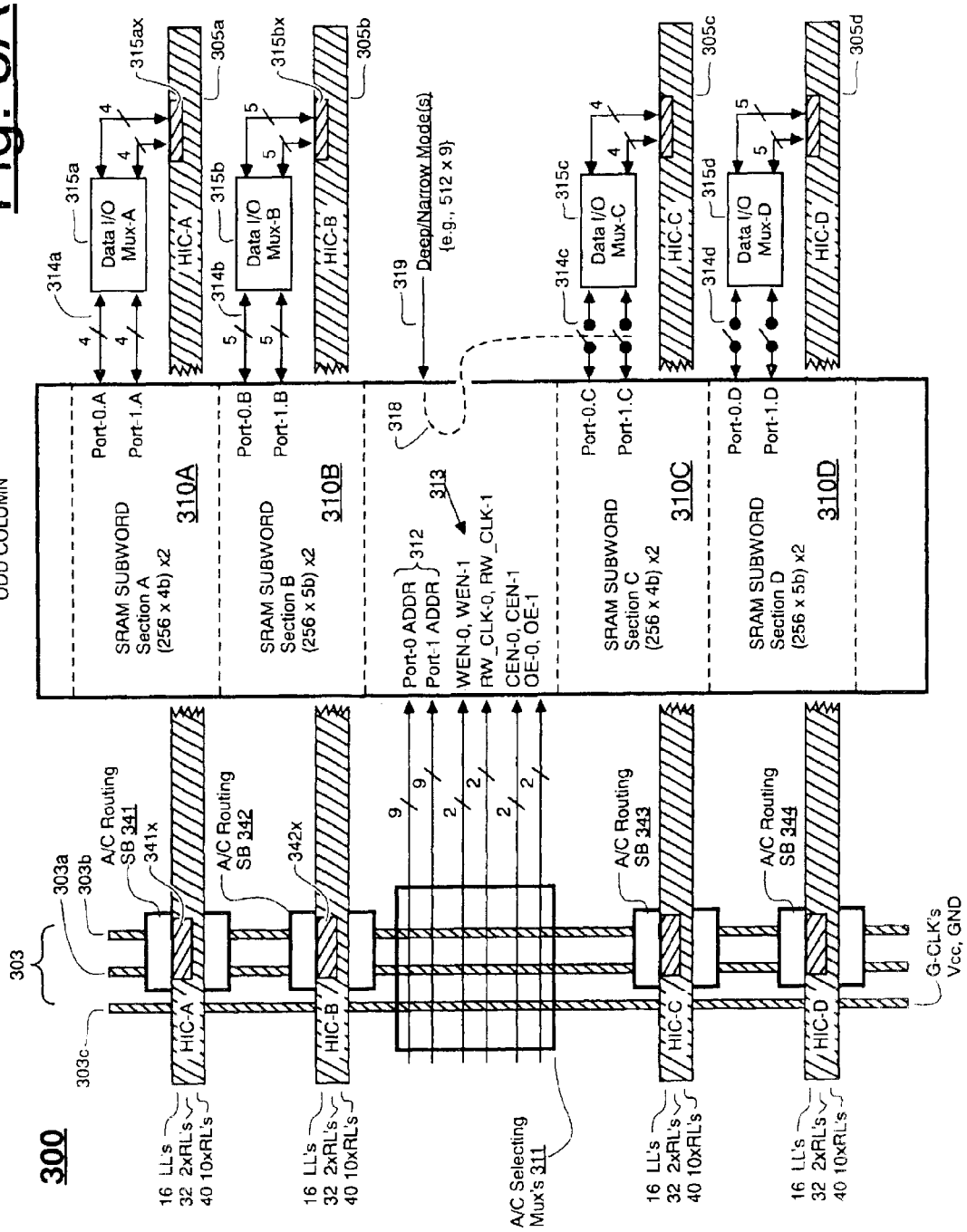
FIG. 3A shows an odd-column memory block of one embodiment.

FIG. 3A is a block diagram of a portion of an FPGA 300 that includes in its odd-numbered memory columns, a plurality of dual ported configurable memory blocks with each being structured like the illustrated, odd-column, CMB 310. Extending through the region of CMB 310 there is a plurality of four HIC's (horizontal interconnect channels) identified as 305a–305d. In this embodiment 300, each such HIC includes sixteen (16) longlines, thirty-two (32) double-reach length lines (2×RL's) and forty (40) deca-reach length lines (10×RL's). A horizontal 2×RL line is relatively short and extends as a continuous conductor into or through just 3 vertical interconnect channels for allowing a first switching resource in a first of the channels communicate with either or both of like switching resources in the other two channels.

FIG. 3A shows four (4) address and control routing switch boxes (A/C Routing SB's), 341–344 respectively intersecting each with a respective one of HIC's 305a–305d (where the latter horizontal interconnect channels are also identified respectively as HIC's A-D). Each A/C Routing SB (341–344) may be used for selectively acquiring A/C signals from its respective HIC and injecting the acquired signals into a vertically-extending, A/C routing channel 303. In one embodiment, the A/C Routing SB's cannot pick up such A/C signals from the deca-reach lines (10×RL's) of the corresponding HIC. This is indicated in the drawing by showing the area of active intersection as hatched region 341x overlapping with SB icon 341, hatched region 342x overlapping with SB icon 342, and so forth. Also in the same or an alternate embodiment, memory data I/O transfers between the CMB 310 and the associated HIC's 305a–305d occurs only by way of the longlines in those HIC's. This is indicated in the drawing by showing the area of active intersection as hatched region 315ax adjacent to multiplexer icon 315a, hatched region 315bx adjacent to multiplexer icon 315b, and so forth. Of course, other interconnect structures are possible with different kinds of lines being included in them and different subsets of active interaction may then be identified by hatched regions such as 341x, 315ax for those differently organized, interconnect lines.

The illustrated, vertical A/C distribution channel 303 includes three (3) signal distribution sections, 303a, 303b and 303c. Distributing sections 303a and 303b are substantially equivalent and thus programmably interchangeable. Each can independently carry a set of address signals 312 and control signals 313 to a respective one of two (2) ports in the dual ported CMB 310. Alternatively, some of the signals carried by one of the programmably interchangeable sections 303a–303b can be commonly supplied to both of Port-0 and Port-1 of the CMB 310. A/C distributing section 303c carries global signals such as a plurality of eight (8) global clock signals and the Vcc and ground (GND) signals. The latter clock and logic 0/1 signals may also be used as control signals, particularly where such may be applied to the clock and/or clock enable terminals of section 313 of the illustrated CMB.

FPGA section 300 includes an address/control selecting multiplexer unit 311 which may be programmed to selectively acquire signals traveling down the A/C distributing channel 303 and to supply the selectively acquired signals to control terminals (312, 313) of the corresponding CMB 310. It is to be understood that other CMB's (not shown) of the same odd-numbered memory column will each have their own A/C-selecting Mux's for selectively coupling the same or different address and/or control signals to those respective other CMB's as may be appropriate. In the illustrated embodiment, each of the dual ports, Port-0 and Port-1, receives 9 bits of address signals (312), a write-enable signal (WEN), a read/write clock signal (RWCLK), a clock enable signal (CEN) and an output enable signal (OE). The OE signal can control activity of a respective data-output tri-state buffers (not shown—see 316 of FIG. 3C).

The data I/O section of configurable memory block 310 can operate in either a shallow-and-wide mode of 256 words by 18 bits per port or in a deep-and-narrow mode of 512 words by 9 bits per port (512×9). The data I/O communication signals of the CMB 310 are distributed across four subword sections: 310A, 310B, 310C and 310D. FIG. 3A shows that the first subword of each port is four-bits wide and that it passes through a corresponding and bidirectional data I/O multiplexer section 315a. Data I/O Mux 315a (also referred to as 110 Mux-A) provides communication between the first subword section, 310A and programmably selected lines within corresponding HIC 305a. As already explained, in one embodiment only the horizontal longlines are programmably selectable; this being indicated by hatched region 315x.

The second subword of each port is five-bits wide and that it passes through a corresponding and bidirectional data I/O multiplexer section 315b for communication with HIC 305b. Similarly, a next set of four bits passes through data I/O multiplexing section 350c for communication with HIC 305c. Lastly, another set of five bits of each port pass through data I/O multiplexing section 350d for communication with HIC 305d.

A mode control signal 319 is supplied to CMB 310 from the configuration memory (not shown) or elsewhere for determining whether the CMB 310 will be operating in shallow-and-wide mode (e.g. 256×18) or in deep-and-narrow mode (e.g. 512×9). If the shallow-and-wide mode is selected, all of data I/O buses 314a through 314d will be active for both inputting and outputting of their respective four or five bits of data per port. On the other hand, if the deep-and-narrow mode is selected, then the schematically illustrated switches at 314c and 314d will effectively open to make corresponding data I/O buses 314c and 314d unusable. The narrow-mode 9 bits per port of the odd-column CMB 310 will instead only pass through data I/O buses 314a and 314b. Dashed icon 318 indicates that the Deep/Narrow mode (or modes, there can be more than one) can render unusable, one or more of the lower subword, data I/O buses (e.g., 314c and 314d).

Figure 3B:
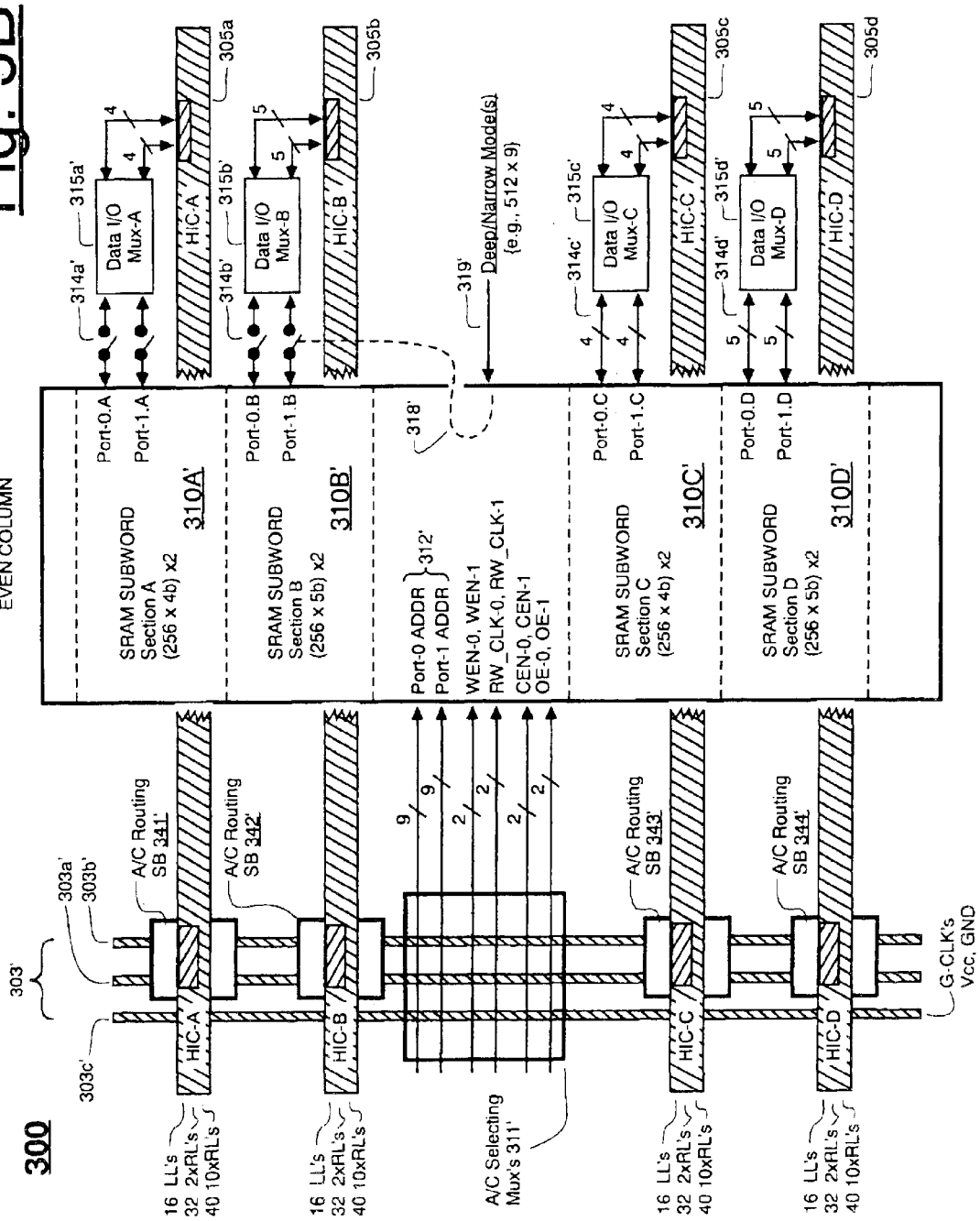
FIG. 3B shows an even-column memory block which complements the configurable memory block of FIG. 3A.

FIG. 3B shows an even-column CMB 310' of the same FPGA 300. It is to be understood that a plurality of alike, dual ported configurable memory blocks are further provided in each even-numbered column and are structured like the illustrated, even-column, CMB 310'. A swap of organization can of course be made so that even columns are populated with what are referred to herein as odd-column CMB's and odd numbered columns are populated with what are referred to herein as even-column CMB's. Where practical, like reference numbers with primes at the end (') are used to indicate similar elements of FIG. 3B that correspond to alike elements of FIG. 3A. HIC sections 305a–305d are however part of the same horizontal interconnect channels as those shown in FIG. 3A. The primary difference for FIG. 3B is that the deep-and-narrow mode works through link 318' to render unusable, one or more of the upper data I/O buses 314a' and 314b' instead of the lower data buses as is shown in FIG. 3A. Consequently, when both of CMB 310 (FIG. 3A) and CMB 310' (FIG. 3B) are in a same deep-and-narrow mode, the odd column CMB (FIG. 3A) will provide data I/O coverage for a first subset of channels, like HIC-A and HIC-B for example, whereas the even column CMB (FIG. 3B) will provide coverage for a second, mutually exclusive subset of channels, like HIC-C and HIC-D for example. Thus, complementary coverage will be provided for at least some, and more preferably, all of the horizontal interconnect channels extending through, or associated with, both of CMB's 310 and 310'.

FIG. 3C shows a possible design for the data I/O multiplexers of CMB subword sections A and C. In this embodiment, each of the HIC's (e.g., 305a or 305c) has 16 longlines numbered as 0 through 15. PIP distribution for these longlines are shown within multiplexer box 315(a,c). Longlines are driven by tristatable buffers in this embodiment. Accordingly, each PIP may be constituted by a tri-state driver and an input buffer as is shown in Legend 316. The output enable (OE') of each tri-state drive is driven by a control signal provided by the CMB 310". The logic for that OE' signal takes into account whether the port WEN is active, whether the respective OE-1 or OE-2 signal is true (FIGS. 3A–3B), whether the CMB 310" is in shallow/wide mode or deep/narrow mode and whether the configuration memory indicates that this PIP is to be active. If the PIP is not activated by the FPGA's configuration memory, then OE'=0. If the port WEN is active, then again OE'=0 because data is being input for a WRITE operation rather being output for a READ operation. The input buffer of each PIP (316) may be driven by a configuration memory bit (m) or a decoding of plural ones of such configuration memory bits such that input signals are statically multiplexed from horizontal lines and through configuration-activated ones of the PIP input buffers to the vertical lines in region 315(a,c).

Figure 3D:
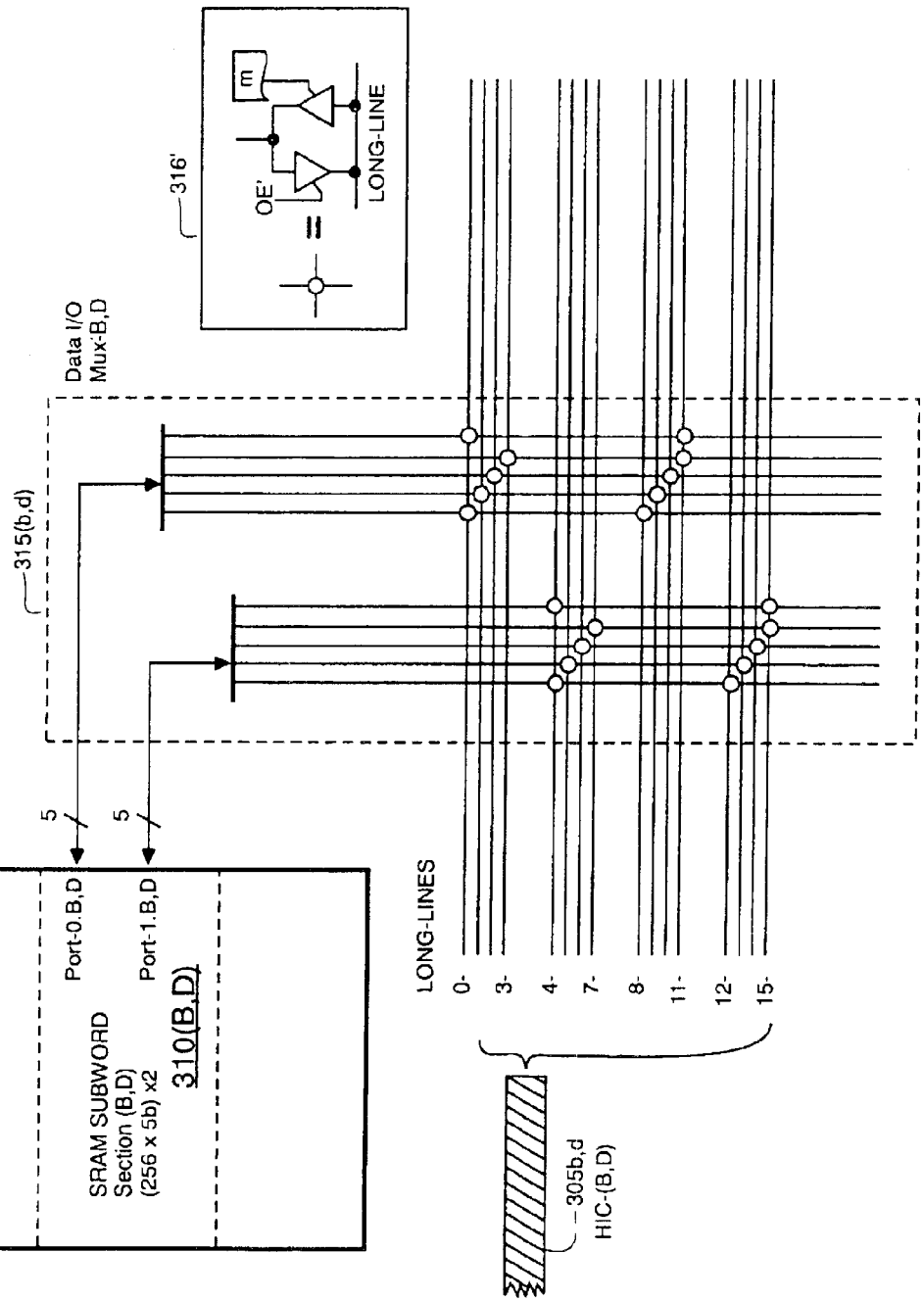
FIG. 3D shows a data I/O multiplexer which can be used for the 5-bit wide subwords of the configurable memory blocks of FIGS. 3A and 3B.

FIG. 3D is substantially similar to FIG. 3C and illustrates a possible distribution of PIP's for subword sections 310B and 310D of the CMB 310". As seen in multiplexer box region 315(b,d), an additional fifth PIP is added to longlines 0, 4, 11 and 15. Other distributions for the fifth PIP of each port are possible. Like the other memory data I/O bits, the fifth bit of each port has at least two different longlines by way of which it may be routed out of or routed into the CMB 310'.

Figure 4A:
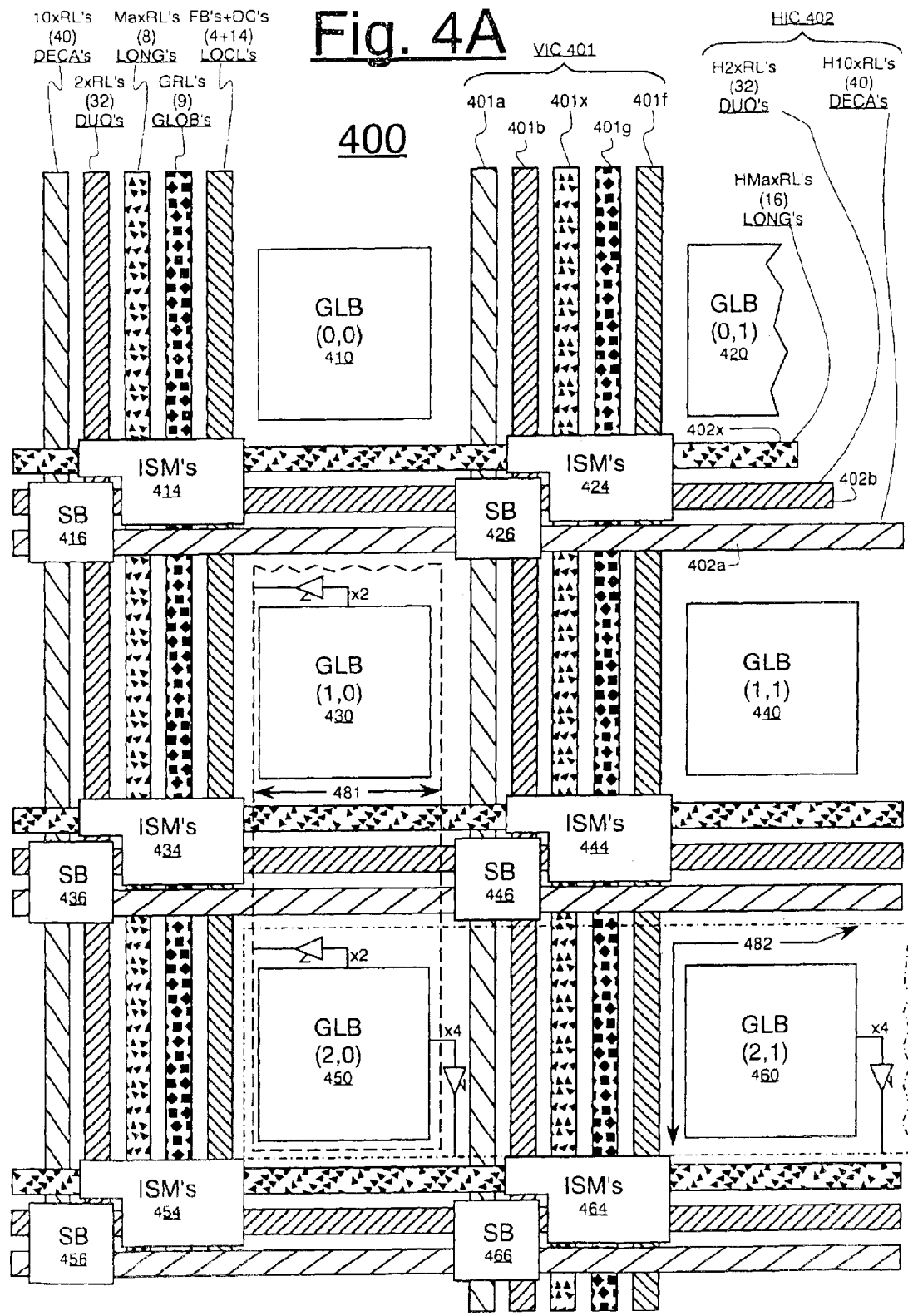
FIG. 4A is a block diagram showing horizontal and vertical interconnect channels of one embodiment in accordance with the disclosure.
Figure 4B:
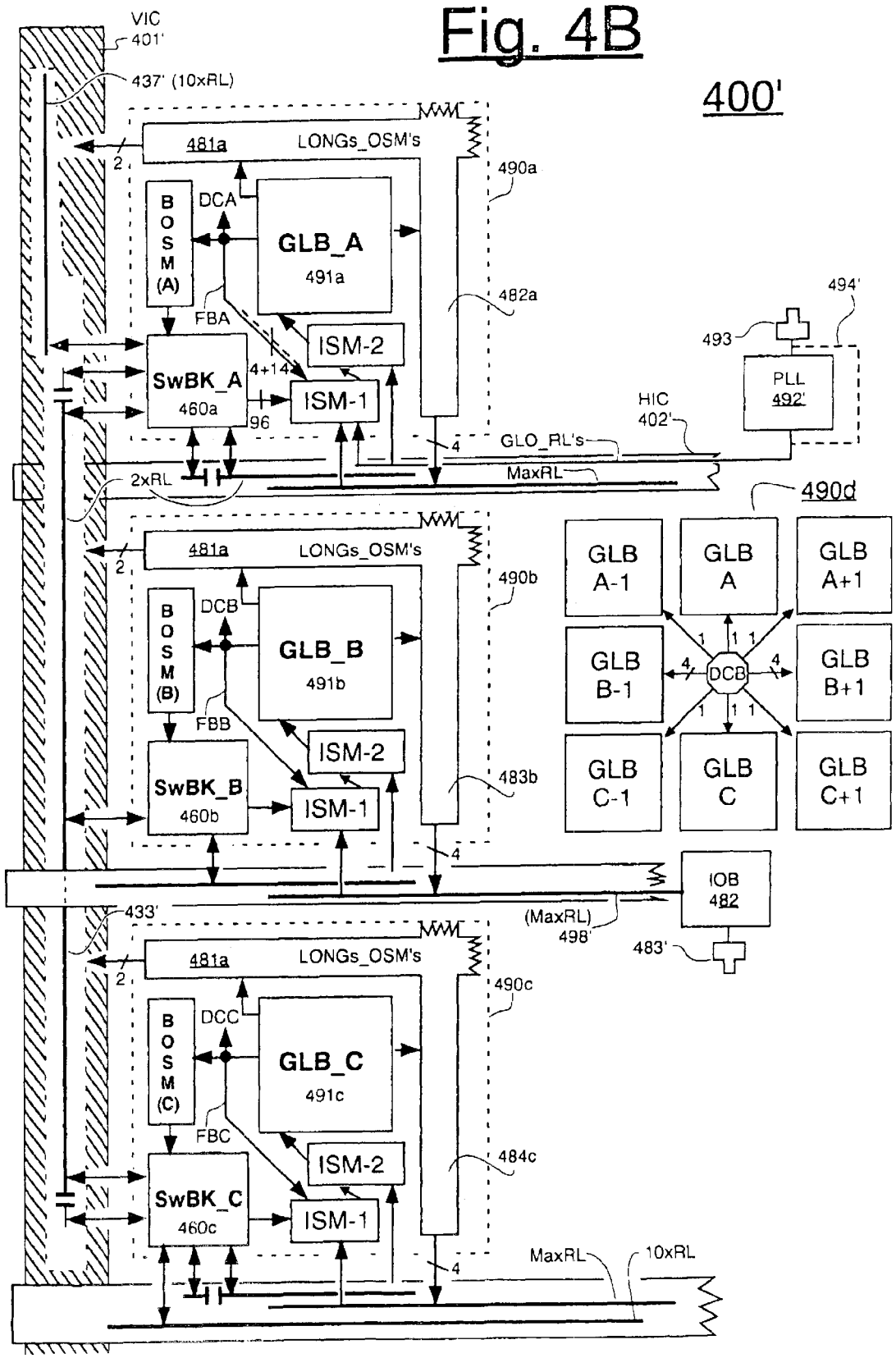
FIG. 4B shows possible details for one embodiment of the structure of FIG. 4A.
Figure 4C:
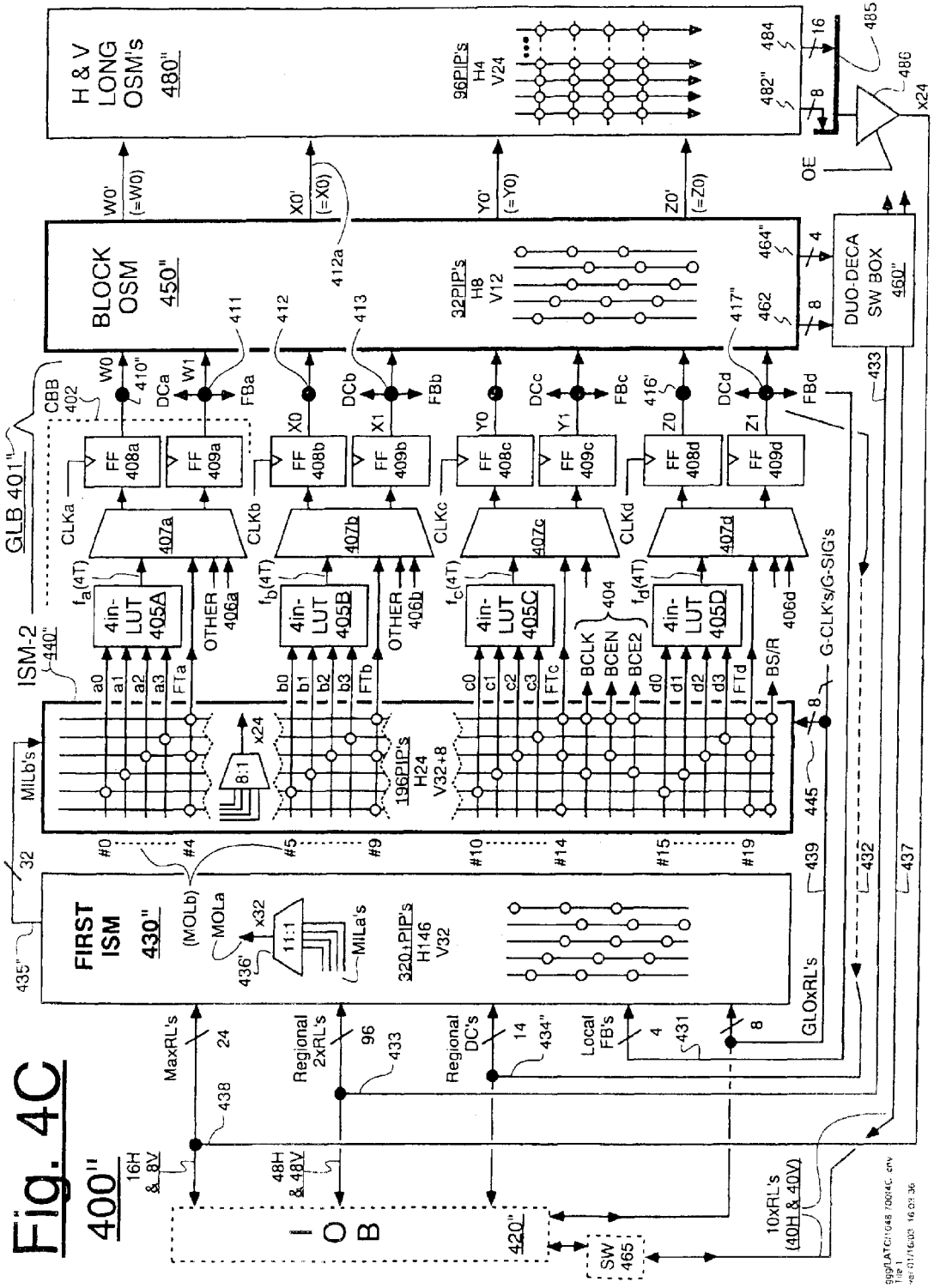
FIG. 4C shows possible details for one embodiment of the structures of FIGS. 4A and/or 4B.

FIGS. 4A–4C are presented for providing background material in preparation for understanding the horizontal joiner box of FIG. 5. More specifically, FIG. 4A is a block diagram of an FPGA 400 organized in accordance with the present disclosure to have HIC's (horizontal interconnect channels; e.g., 402) and VIC's (vertical interconnect channels; e.g., 401) which can be integrated with the CMB's (configurable memory blocks) of one or more of FIGS. 2A–3C.

The illustrated tiling arrangement 400 of FIG. 4A may be used for arranging Generically-variable Logic Blocks (GLB's) such as the illustrated blocks 410–460 relative to one another and relative to corresponding Input Switch Matrices (ISM blocks) 414–464 and relative to corresponding, Data-routing SwitchBoxes (SB's) 416–466 of the neighboring interconnect. The tiling arrangement 400 is taken at a macroscopic level of view and is to be understood as not being to scale. In one embodiment, the circuits of the ISM's (e.g., 414) and SB's (e.g., 416) are intermingled in an L-shaped region overlapping with the intersecting vertical and horizontal interconnect lines and this L-shaped region (not shown) is substantially larger in circuit area than the area occupied by the circuitry of the corresponding GLB (e.g., 410). It is to be understood that many variations may be possible for: (1) what constitutes the respective GLB's 410, 420, etc.; (2) what constitutes the respective ISM blocks 414, 424, etc.; (3) what constitutes the respective Data SB's 416, 426, etc., and (4) what constitutes the respective neighboring interconnect (e.g., Vertical Interconnect Channel {VIC} 401 and Horizontal Interconnect Channel {HIC} 402 of neighboring GLB 420. As such, the tiled layout 400 of FIG. 4A is to be taken as nonlimiting with respect to constituent components shown therein and descriptions herein of examples of such constituent components are to be taken as nonlimiting with respect to the illustrated tiling arrangement 400 of FIG. 4A.

Within the illustrated Vertical interconnect channel (VIC) 401, elements 401a, 401b, 401x, 401g and 401f respectively refer to: (a) included 10×RL lines (deca-reach length lines), (b) included 2×RL lines (duo-reach length lines), (x) included longlines, also referred to as MaxRL lines (maximum-reach length unidirectional lines within their respective memory partitions), (g) global reach lines, and (f) local, intra-GLB feedback lines (FB's) and dedicated, inter-GLB direct-connect lines (DC's). Elements 402a, 402b, and 4021x of the illustrated HIC 402 respectively refer according to their suffixes to same kinds of lines that instead extend horizontally. As can be seen, the horizontal duo's and longs (402b and 402x) have conductors that define adjacent interconnect lines (AIL's) of ISM blocks such as 424. The vertical duo's and longs (401b and 401x) also have conductors that define AIL's of respective ISM blocks such as 424. Horizontal and vertical Deca's (10×RL lines in groups 401 a and 402a) do not participate in this embodiment 400 as AIL's of any ISM block such as 424. Instead, the data switchboxes (e.g., SB 424) and associated 2×RL lines must be used in this embodiment as highway entrance and exit ramps (metaphorically speaking) for moving signals out of the 10×RL lines by way of local roads (metaphorically speaking) that are defined by corresponding 2×RL lines (e.g., 401b, 402b) extending into same ones of the duo-deca switchboxes (e.g., 426). See also the duo-deca switchbox 460" of FIG. 4C.

As can be further seen in FIG. 4A, various GLB interconnecting and/or GLB intraconnecting lines, as well as global-reach conductors (401g) pass through ISM blocks such as 424 for providing signal input into the corresponding GLB's. The input signals which are selectively acquired by the ISM block's (e.g., 424) can be processed by the corresponding GLB (e.g., 420). GLB outputs may then returned to the AIL's for local continuation (e.g., via the FB's and/or DC's) and/or for general continuation (e.g., via the local duo-deca switchbox, and then through the 2×RL and/or 10×RL lines) and/or long distance continuation (e.g., via the MaxRL longlines). Horizontal and vertical, Longlines Output Switch Matrices (LOSM's) are provided in the design to service respective horizontal and vertical sequences of plural GLB's. Part of a vertical one of such sequences of GLB's is shown in FIG. 4A, as dashed box 481 (denoted below GLB 430). Part of a horizontal one of such sequences of 4 GLB's is shown in FIG. 4A as dashed box 482 (denoted around GLB 460). Longline drive capability per GLB is asymmetrical in the illustrated embodiment 400, with each vertical LOSM (481) being able to selectively forward just two outputs (e.g., W0' and Y0' of FIG. 4C) from each of its corresponding 4 GLB's to the adjacent, vertical MaxRL lines, and with each horizontal LOSM (482) being able to selectively forward four outputs (e.g., W0', X0', Y0' and Z0' of FIG. 4C) from each of its corresponding 4 GLB's to the adjacent, horizontal MaxRL lines. Thus each vertical LOSM (481) has 8 tri-state drivers (only 4 indicated in FIG. 4A) driving a corresponding 8 longlines in the adjacent VIC while each horizontal LOSM (482) has 16 tri-state drivers (only 8 indicated in FIG. 4A) driving a corresponding 16 longlines in the adjacent HIC. The less numerous, vertical MaxRL lines (401x) are preferably used for broadcasting control signals along columns of GLB's while the more numerous, horizontal MaxRL lines (402x) are preferably used for broadcasting data-word signals along rows of GLB's.

FIG. 4B shows further details of an embodiment 400' corresponding to that of FIG. 4A. Many of these details are not highly important to the present discussion. It can be observed that the general interconnect includes so-called 2×RL lines and so-called 10×RL lines. One vertical 2×RL line (433) is shown within VIC 401' as being a continuous conductor that extends a sufficient length to just reach from switchbox 460b (SwBK-B) to two closest ones and vertically adjacent switchboxes, 460a (SwBK-A) and 460c (SwBK-C). Because of the placement of the switchboxes in corners of their respective, GLB logic tiles, the 2×RL lines need not be longer than about the sum of two times the vertical side dimension of a given GLB tile (490a, 490b, etc.) plus the widths of two channels. The three GLB's (e.g., 491a, 491b, 491c) serviced by a given 2×RL line may lie adjacent to one another in a same row of GLB's or a same column of GLB's. It is seen from FIG. 4B that each corresponding 2×RL line (e.g., 433) allows any GLB (e.g., 491a) to talk, through its respective switch block (e.g., 460a) to any two other GLB's (e.g., 491b, 491c) that lie adjacent to the given 2×RL line.

The illustrated longlines (MaxRL lines, 401x, 420x in FIG. 4A), Double-lines (2×RL lines 401b, 420b in FIG. 4A), along with other kinds of illustrated lines: Local FB's 401f, Regional DC's—also 401f, and global-reach length lines (GRL's 401g in FIG. 4A), feed into the user-programmable, first Input Switch Matrix stage (ISM-1) or second Input Switch Matrix stage (ISM-2) as shown in FIGS. 4B and 4C. It is seen in FIG. 4B, that a global-reach-carried signal can be a phase-loop-locked clock signal produced by PLL 492 and derived from an external signal input on package terminal 493 or a direct clock or another kind of signal input by way of the illustrated, programmably-activated, PLL-bypass path 494. In one embodiment, each vertical inter/intra-connect channel (e.g., VIC 401 of FIG. 4A) comprises 40 10×RL lines, 32 2×RL lines, 8 MaxRL lines, 4 local feedback lines, 14 direct-connect lines, and 9 global-reach lines. Each horizontal interconnect channel (e.g., HIC 402 of FIG. 4A) comprises 40 10×RL lines, 32 2×RL lines, and 16 MaxRL lines. Neither of VIC 401 and HIC 402 contains any single-length reach lines which are limited to coupling together just two adjacent switchboxes.

It is further seen in FIG. 4B that each GLB tile (e.g., 490b) may include a Block Output Switch Matrix (BOSM) for selectively routing the GLB output signals to the local switchbox (e.g., 460b) for further routing to the adjacent interconnect lines (AIL's such as 2×RL lines, 10×RL lines, and MaxRL lines). Each GLB tile (e.g.,490b) may further includes a direct-connect sourcing node (e.g., DCB) which directly connects to 14 nodes in the ISM-1 stages of 8 neighboring GLB-tiles. One specific, DC sourcing pattern which may be used is shown at 490d in FIG. 4B.

FIG. 4C, shows a particular embodiment 400" of internals of a signal processing/routing node in accordance with the present disclosure. The processing/routing node includes ISM stages, a GLB, a data switchbox, a local OSM and a distributed OSM (LOSM). Some of the more notable detailed features include are the following:

(a) The provision of plural, simultaneously-accessible registers (e.g., 408a, 409a) for each of plural LUT's (lookup tables) in the GLB 401";

(b) The provision of primary feedthrough lines (e.g., FTa–FTd) that can transmit locally acquired input signals (e.g., of bus 435) to the plural state-storing registers (e.g., registers 408a–409d) and/or that can transmit such locally acquired input signals from virtually any kind of adjacent interconnect line (e.g., MaxRL, DC) or intra-connect line (e.g., FB) to virtually any kind of other adjacent interconnect line (e.g., 2×RL, DC, MaxRL) or intra-connect line (e.g., FB);

(c) The provision of register-feeding multiplexers (e.g., 407a) that can select from amongst LUT output signals (e.g., $f_a(4\ T)$), and/or the signals of the primary feedthrough lines (e.g., FTa) and/or other signals (e.g., 406a) for feeding to data inputs of the plural state-storing registers or, if such registers are bypassed, for feeding to output routing structures (e.g., BOSM, HN-LOSM, DC, FB) of the bypassed registers;

(d) The provision of local feedback lines (431, FBa–FBd) that can feed back registered signals—or unregistered signals, if the particular register is programmably bypassed—where the so-feedback signals (431) may define part of a set of selectable signals which may be locally acquired for further processing by a corresponding Generic Logic Block (GLB) 401 that generates the local feedback signals; and (e) The provision of the block output switch matrix 450" (BOSM) and an interconnect switchbox 460" for each GLB and the access of each GLB to associated, horizontal and vertical, Longline Output Switch Matrices 480". Although the Longline Output Switch Matrices (H&V LOSM's) 480" are shown to be conceptually separate from the BOSM 450" (Block Output Switch Matrix) in FIG. 4C, it is to be understood that the BOSM and LOSM structures can be physically integrated to define a general OSM (Output Switch Matrix) structure and that slices of such an integrated OSM can be respectively associated with respective GLB's (only one shown in FIG. 4C: GLB 401"). Moreover, even though the vertical and horizontal longlines (MaxRL lines) are shown to be merging into a combined, H&V LOSM's structure 480"; in one embodiment the HLOSM's are separate from the VLOSM's. The connectivity of each GLB to both the HLOSM's and the VLOSM's remains though.

It may be understood from FIG. 4C that one or more general input signals may be acquired by the ISM-1 stage associated with a particular GLB from the Adjacent Interconnect Lines (AIL's) of that GLB. The AIL's of each GLB/ISM combination may include lines such as those of a first illustrated bus 433 (horizontal and vertical duo-reach lines or 2×RL's), a second illustrated bus 438 (horizontal and vertical, maximum-unidirectional-reach lines with tristate capability, or MaxRL's) and a third illustrated bus 439 (global clock and/or signal lines, GLOxRL's). It is to be understood from FIG. 4C that the illustrated ISM/GLB/OSM combination (more specifically the combination of ISM stages 430"/440", GLB 401" and OSM 450"/480") constitutes part of a repeatable arrangement 400" that may be repeated in tiled form (see also FIG. 4A) within an FPGA provided on a monolithically integrated circuit chip or another such circuit support means. Some amount of braiding (e.g., among the 2×RL lines) may be provided between tiles to avoid signal collision (e.g., the place-and-route software trying to get 2 different signals onto a same numbered 2×RL line of two adjacent tiles).

Referring still to FIG. 4C, GLB acquired and processed result signals (e.g., the signal, $f_{a-d}(4\ T)$, that is ultimately generated on terminal W0) can be coupled to the general, GLB/IOB interconnect of the FPGA by way of the Block Output Switch Matrix (BOSM 450") and the horizontal and vertical Longlines Output Switch Matrices (HLOSM, VLOSM—collectively shown as 480"). Line W0', incidentally, is equivalent to node W0.

In the illustrated embodiment, the Block OSM 450" (BOSM) feeds into the main duo-deca switchbox 460". The latter switchbox 460" can be user-programmed to route the BOSM's output signals 462 and 464 respectively onto the adjacent duo-reach general interconnect lines (2×RL's) 433 and onto deca-reach general interconnect lines (10×RL's) 437. Additionally, the duo-deca switchbox 460" can programmably route signals between various ones of the 2×RL and 10×RL lines passing through that switchbox 460".

A first plurality of 48 'taps' are provided on the first-stage ISM 430" for accessing adjacent and horizontal ones of the 2×RL's. A second plurality of 48 more 'taps' are provided on the first-stage ISM 430" for accessing adjacent and vertical ones of the 2×RL's. These 96 taps allow the first-stage ISM 430" to selectively acquire signals from a respective 96 duo-reach access wires associated with bus 433 (and with duo-deca switchbox 460"). The selected subset of the 96 tap-able duo signals (433) that may be acquired by ISM-1 can then be routed to ISM-2 (440") via the inter-stage bus 435. Although FIGS. 4A–4B show only 32 horizontal 2×RL lines and 32 vertical 2×RL lines provided across adjacent interconnect channels of each GLB (e.g., 401). The reason why this arrangement nonetheless effectively translates into 96 unique signal taps at the ISM-1 stage is because the bundles of 2×RL lines passing through each duo-deca switchbox can be designated as belonging to one of three groups: those 2×RL lines whose middle taps are passing-through the box; those 2×RL lines whose top (T) or left side (L) is terminating in the box; and those 2×RL lines whose bottom (B) or right (R) side is terminating in the box. Each group has 16 vertical or 16 horizontal 2×RL lines in it. There are 3 vertical groups of this type and 3 horizontal groups of this type extending into each switchbox. Hence we have 48 horizontal lines plus 48 vertical lines, thereby defining a total of 96 tap-able 2×RL lines extending into each corresponding switchbox.

The illustrated, Longline OSM's 480" (LOSM) may be collectively thought of as comprising an intersecting set of four horizontal, matrix input lines (H4) and twenty-four vertical, matrix output lines (V24) whose intersections are fully populated by a set of ninety-six PIP's. As a result, any of the W0, X0, Y0 and Z0 signals may be routed to any one of twenty-four tristateable buffers associated with GLB 201. The latter tristateable buffers (486) receive their respective inputs from output lines 482" and 484 of the H&V longline OSM's 480". Symbols 485–486 represent the set of twenty-four (×24) tristateable longline drivers and their respective output enable terminals (OE). In one embodiment, 16 of the twenty-four MaxRL's that can be driven by the HVOSM 480" extend horizontally along the corresponding horizontal interconnect channel (HIC) adjacent to GLB 401" while the remaining 8 extend vertically along the corresponding vertical interconnect channel (VIC) adjacent to GLB 401".

An Input/Output Block (IOB) 420" is drawn as a dashed box in FIG. 4C to generally represent the interconnectability of GLB 401" to other GLB's and/or IOB's and/or embedded memory blocks (e.g., the CMB's of FIGS. 2A–3D. A variety of different interconnect structures may be used for providing selective interconnection between GLB's and/or IOB's and/or CMB's. In one embodiment, 10×RL lines such as those of bus 437 couple to associated IOB's 420" by way of duo- deca switchboxes such as the illustrated SWbox 465.

In one embodiment, there are no bridges other than the FT's for transferring signals from MaxRL lines to other interconnect conductors (e.g., 2×RL lines, 10×RL lines—if passed from the BOSM and through a switchbox). Accordingly, the feedthroughs (FT's) must be used in that embodiment if a signal that is being broadcast on a given MaxRL line is to be further distributed orthogonally or otherwise by other GLB-interconnect lines. The 2×RL and/or 10×RL lines may be used for such distribution of a given signal from a MaxRL line to a cluster of GLB's. Moreover in the same embodiment, 10×RL lines cannot directly feed input signals into GLB's or IOB's. The 2×RL lines must be used as intermediaries for moving a signal from a 10×RL line into a GLB or IOB. Moreover in the same embodiment, only horizontal longlines (MaxRL lines in the HIC's) directly transfer storage data between the configurable memory blocks (CMB's) and the rest of the FPGA. On the other hand, address/control (A/C) signals may be switched into the A/C distributing channels (e.g., 303) from 2×RL lines as well as from horizontal longlines. There is a relatively small number of longlines and a relatively larger number of 2×RL lines per interconnect channel. Therefore, it is generally desirable to use the 2×RL lines for injecting address/control (A/C) signals into the A/C distributing channels (e.g., 303). The longlines should be used for this function only when a common control signal is being broadcast and used across a whole memory partition or a plurality of memory partitions.

FIG. 5 may now be appreciated in view of the background given for FIGS. 4A–4C. The H-joiner 570 shown in FIG. 5 appears to be relatively simple and yet it provides a subtle balance between having too much flexibility and not enough. In one embodiment, each memory column (e.g., 223, 224, 225, 226 of FIG. 2A) occupies a vertical tiling slot that could otherwise have been occupied by a GLB or an IOB. It is desirable to have a smooth stitching of signal routing from one memory partition (e.g., 201 of FIG. 2A) to another (202) without placing too many encumbrances on the place-and-route software and without allowing the software (501) to get itself into trouble because of how the software uses H-joiners. More specifically, FIG. 5 shows an organization 500 in which there is at least one 2×RL line 502 which extends continuously through the horizontal joiner 570 without breakup so as to allow short-haul communication between a left-partition GLB, 552 and a right-partition GLB, 553 irrespective of what the place and route software 501 does inside the H-joiner 570. Because 2×RL line 502 in unbreakable by the H-joiner 570, the place and route software 501 is prevented from breaking open or disjoining communications capabilities between the left and right-partitions to such an extent that no communication is possible between the partitions via the use of double-reach length lines (2×RL lines). At the same time, additional 2×RL lines 503 and 504 are provided to terminate within the H-joiner 570 and a first PIP 564 is provided between their terminal end taps for programmably joining or disjoining them. If PIP 564 is left open by the place and route software (501), then independent address or control signals may be transmitted separately via line 503 to the left-partition memory switch box 542 and via line 504 to the right-partition memory switch block 543. There are three tap points on each 2×RL line. Each tap point corresponds to a GLB tile slot. Thus, the leftmost tap point on line 503 corresponds with GLB 551, the middle tap point corresponds with GLB 552, and the right tap point corresponds with H-joiner 570. Similarly, the rightmost tap point on line 504 corresponds with GLB 554, the middle tap point corresponds with GLB 553 and the leftmost tap point corresponds with H-joiner 570. There are also three tap points on double-reach line 502. The H-joiner 570 may use the middle tap point of 2×RL line 502 while GLB 552 couples to the left tap point and GLB 553 couples to the right tap point.

Double-reach length lines 502, 503 and 504 are different than most such 2×RL lines because lines 502–504 extend through memory switch boxes such as 542 (in the left partition) and 543 (situated in the right partition). An address or control signal may be injected from 2×RL line 503 into either or both of the Port-0 and Port-1 A/C subsections of control bus 530B by way of PIP's 581 and 582. Similarly, an address or control signal may be injected from 2×RL line 504 by way of PIP's 583 and 584 to either or both of the Port-0 and Port-1 A/C subsections of control bus 530A (where the latter is situated in the right-partition). The partitions-joining structure 500 is intentionally organized so that there is no one-stop PIP routing connection between 2×RL line 502 and either of the left and right memory switch boxes 542–543. Instead, if the place and route software 501 wishes to transmit an A/C signal from line 502 into either of A/C buses 530B and 530A, it must do so by passing the to-be injected signal through at least one of PIP's 572 and 573 before the injected signal can then be passed through PIP's 581, 582, 583 or 584 into the A/C vertical buses 530A, 530B. The longer delay associated with passing through a sequential series of these PIP's discourages the place and route software 501 from using 2×RL line 502 for such a function and it encourages the place and route software 501 to instead use those of the 2×RL lines which terminate in H-joiner 570, such as lines 503 and/or 504. If this hardware-based encouragement is followed, double-reach line 502 should remain available for transmitting a non-A/C signal between GLB 552 and 553. The place and route software 501 will be encouraged to avoid programming itself into a corner by consuming all 2×RL lines just for carrying memory A/C signals. Instead, the place and route software 501 will be encouraged to use those of the 2×RL lines likes 503 and 504 which can provide independent A/C control drives to the A/C control buses of the left-partition CMB 510B and the right-partition CMB 510A.

The use of the tri-state buffers 575 and 577 shown in FIG. 5 should be fairly apparent from the earlier description of FIG. 2C. If a data or control source 511 in the left-partition is to drive its respective control signal onto right-partition longline 505R, then right-driving tri-state buffer 575 will be activated while the complementary, and left-diving, tri-state buffer 577 will be left in the high impedance state. Since setting of its configuration memory bit (m) to true will place the right-driving tri-state buffer 575 into a run-time state of permanently driving the right-partition longline segment 505R, the place and route software 501 should block all tri-state buffers in the right-partition from trying to drive signals onto the permanently-mastered longline 505R. On the other hand, any tri-state driver in the left-partition can take over mastery of left-partition longline segment 505L and that signal will be mirrored by way of buffer 575 onto the corresponding longline segment 505R in the right-partition. The signal that is driven onto the left-partition longline 505L can be injected into any one or more of the left-partition A/C control buses 530B and the right-partition A/C control buses 530A by way of PIP's 591–594.

If the left-driving, tri-state buffer 577 is instead activated while buffer 577 remains deactivated, then a signal source 514 in the right-partition may transmit its signals to a left-partition destination by way of longline segments 505R and 505L. If neither of tri-state buffers 575 a nd 577 is programmably activated, then the left and right longline segments 505L and 505R in the respective left and right partitions may be operated independently of each other. In other words, a left-partition source 511 can send its signal via line 505L to a left-partition destination 512 and/or to A/C control bus 530B at the same lime that a right-partition source 514 sends its signal via line 505R to a right-partition destination 513 and/or to a right-partition control bus 530A.

Although FIG. 5 shows just three double-reach lines 502–504 and two longline segments, 505L and 505R extending into, or through, the illustrated H-joiner 570, it is to be understood that many more copies of such interconnect lines will typically pass through each H-joiner unit and that similar joining features such as PIP's 572, 573 and 574 and tri-state buffers 575–577 are provided for such additional lines.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of example, it is understood that the configuring of an FPGA device (e.g., 200 of FIG. 2A) in accordance with the disclosure can include use of a computer program (e.g., 501 of FIG. 5) running on an appropriate platform to carry out activation of the deep-and-narrow and/or shallow-and-wide memory modes and/or activation of the partitions stitching modes described herein. A computer-readable medium or another form of a software product or machine-instructing means (including but not limited to, a hard disk, a compact disk, a flash memory stick, a downloading of manufactured instructing signals over a network and/or like software products) may be used for instructing an instructable machine (e.g., general purpose computer) to carry out place-and-route operations and/or generate FPGA-configuring data for providing such memory mode activations and partition stitchings, where the activities can include selective activation of these features in different part of an FPGA. Generated configuration data may be used to define configuration signals which can be loaded via a programming device into a user programmable FPGA. As such, it is within the scope of the disclosure to have an instructable machine carry out, and/to provide a software product adapted for causing an instructable machine to carry out a machine-implemented method comprising: (a) first determining if a given one or more configurable memory blocks are to operate in shallow-and-wide mode or in deep-and-narrow mode; (b) second determining which of complementary CMB's is to store respective subwords of data if a deep-and-narrow mode is active; (c) third determining if address and/or control signals are to be shared between complementary CMB's and/or CMB's of different partitions; and (d) appropriately programming H-joiners and other interconnect resources to provide common control of CMB's in same or different partitions.

Reservation of Extra-patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A field programmable gate array (FPGA) comprising:
(a) a plurality of logic blocks organized as rows and columns;
(b) a plurality of horizontal and vertical interconnect channels (HIC's and VIC's) extending respectively along the rows and columns of said logic blocks for providing interconnection between the logic blocks;
(c) at least first and second columns of configurable memory blocks (CMB's) embedded among the columns of logic blocks, wherein:
(c.1) each CMB spans a plurality of said HIC's;
(c.2) each given CMB has plural data-I/O sub-busses, operatively coupled to a different one of the HIC's among the HIC's spanned by the given CMB;
(c.3) each given CMB is programmably configurable into at least a respective shallow-and-wide mode in which data-I/O words of the CMB have a relatively large, first number of bits per word and a correspondingly relatively large first number of said data-I/O sub-busses are used for conducting in parallel, the bits of the data-I/O words in the respective shallow-and-wide mode; and
(c.4) each given CMB is further programmably configurable at least into a respective deep-and-narrow mode in which data-I/O words of the CMB have a relatively small second number of bits per word and a correspondingly relatively small second number of said data I/O sub-buses are used for conducting in parallel, the bits of the data-I/O words in the respective deep-and-narrow mode, where the relatively small second number of the respective deep-and-narrow mode is less than the corresponding relatively large, first number of the respective shallow-and-wide mode.

2. The FPGA of claim 1 and further wherein:

(c.5) CMB's which span same HIC's but occupy different columns can be configured into complementary deep-and-narrow modes wherein, if a first data-I/O sub-bus of a corresponding first CMB is unusable because the first CMB is in a respective first deep-and-narrow mode, a complementary second data-I/O sub-bus of a corresponding second CMB in a different column is usable for conducting data of the given HIC to which the unusable first data-I/O sub-bus couples, where the second data-I/O sub-bus also couples to the given HIC.

3. The FPGA of claim 1 wherein said relatively large number of bits of each respective shallow-and-wide mode is at least sixteen.

4. The FPGA of claim 3 wherein said relatively small number of bits of each deep-and-narrow mode is less than ten but greater than zero.

5. The FPGA of claim 3 wherein each respective deep-and-narrow mode provides for random addressing of at least 512 data words in each respective CMB.

6. The FPGA of claim 1 wherein each CMB has at least two independently usable parts structured to receive respectively independent address signals and to independently read from, or write to, respectively addressed data word storage locations of the CMB.

7. The FPGA of claim 1 and further comprising:

(d) at least third and fourth columns of said CMB's embedded among the columns of logic blocks, wherein:

(d.1) the FPGA is divided into plural partitions with the first and second columns of said CMB's occupying a first of the partitions, with the third and fourth columns of said CMB's occupying a second of the partitions, the second partition being horizontally separated from the first partition; and the FPGA further having:

(e) horizontal joiners for programmably joining and disjoining interconnect resources of the first and second partitions.

8. The FPGA of claim 6 wherein:

said sub-busses of the CMB's couple to longline segments in the respective partitions of the CMB's; and said horizontal joiners include programmable tri-state buffers for programmably joining longline segments of the first partition with corresponding longline segments of the second partition.

9. A method for configuring a field programmable gate array (FPGA), where the FPGA includes:

(0.1) a plurality of logic blocks organized as rows and columns;

(0.2) a plurality of horizontal and vertical interconnect channels (HIC's and VIC's) extending respectively along the rows and columns of said logic blocks for providing interconnection between the logic blocks;

(0.3) at least first and second columns of configurable memory blocks (CMB's) embedded among the columns of logic blocks, wherein:

(0.3a) each CMB spans a plurality of said HIC's;

(0.3b) each given CMB has plural data-I/O sub-busses, operatively coupled to a different one of the HIC's among the HIC's spanned by the given CMB;

(0.3c) each given CMB is programmably configurable into at least a respective first shallow-and-wide mode in which data-I/O words of the CMB have a predefined, relatively large number of bits per word and a correspondingly, relatively large number of said data-I/O sub-busses are used for conducting in parallel, the bits of the data-I/O words in the respective, first shallow-and-wide mode; and (0.3d) each given CMB is further programmably configurable into a respective deep-and-narrow mode in which data-I/O words of the CMB have a predefined, relatively small number of bits per word and a correspondingly relatively small number of said data I/O sub-busses are used for conducting in parallel, the bits of the data-I/O words in the respective deep-and-narrow mode, the relatively small number of bits per word of each respective CMB being smaller than the relatively large number of bits per word of the respective CMB;

said configuring method comprising:

(a) configuring CMB's which span same HIC's but respectively occupy different columns into respective complementary deep-and-narrow modes wherein, when a first data-I/O sub-bus of a corresponding first CMB becomes unusable because the first CMB is configured into a first deep-and-narrow mode, the configuring causes a complementary second data-I/O sub-bus of a corresponding second CMB in a different column to become usable for conducting data of the given HIC to which the unusable first data-I/O sub-bus couples, where the second data-I/O sub-bus also couples to the given HIC.

10. A field programmable gate array (FPGA) comprising:

(a) a plurality of logic blocks organized as rows and columns;

(b) a plurality of horizontal and vertical interconnect channels (HIC's and VIC's) extending respectively along the rows and columns of said logic blocks for providing interconnection between the logic blocks;

(c) a plurality of configurable memory blocks (CMB's) embedded among the columns of logic blocks, wherein each CMB is programmably configurable into at least a first mode in which data-I/O words of the CMB have a larger number of bits per word and a second mode in which data-I/O words of the CMB have a smaller number of bits per word.

11. The FPGA of claim 10 wherein:

each CMB has plural data-I/O sub-busses operatively coupled to an HIC; and a correspondingly larger number of said data-I/O sub-busses are used for conducting in parallel the bits of the data-I/O words in the first mode and a correspondingly smaller number of said data I/O sub-busses are used for conducting in parallel the bits of the data-I/O words in the second mode.

12. The FPGA of claim 11, wherein each of the plural data-I/O sub-busses of a CMB is operatively coupled to a different one of the HICs.

13. The FPGA of claim 10, wherein each CMB has at least two independently usable ports structured to receive respectively independent address signals and to independenluy read from, or write to, respectively addressed data word storage locations of the CMB.

* * * * *